United States Patent
Watazu et al.

(10) Patent No.: US 9,864,450 B2
(45) Date of Patent: Jan. 9, 2018

(54) PIEZOELECTRIC SENSOR AND PRESSURE DETECTION APPARATUS

(71) Applicant: NISSHA PRINTING CO., LTD., Kyoto-shi, Kyoto (JP)

(72) Inventors: Yuji Watazu, Kyoto (JP); Yoshiko Suetomi, Kyoto (JP); Eiji Kakutani, Kyoto (JP); Keisuke Ozaki, Kyoto (JP); Junichi Shibata, Kyoto (JP); Katsumi Tokuno, Kyoto (JP); Shuzo Okumura, Kyoto (JP); Ryomei Omote, Kyoto (JP)

(73) Assignee: Nissha Co., Ltd., Kyoto (JP)

( * ) Notice: Subject to any disclaimer, the term of this patent is extended or adjusted under 35 U.S.C. 154(b) by 62 days.

(21) Appl. No.: 14/895,872

(22) PCT Filed: May 21, 2014

(86) PCT No.: PCT/JP2014/063444
§ 371 (c)(1),
(2) Date: Dec. 3, 2015

(87) PCT Pub. No.: WO2014/196359
PCT Pub. Date: Dec. 11, 2014

(65) Prior Publication Data
US 2016/0124560 A1    May 5, 2016

(30) Foreign Application Priority Data

Jun. 4, 2013  (JP) .................. 2013-118296
Jun. 4, 2013  (JP) .................. 2013-118297
Jun. 4, 2013  (JP) .................. 2013-118298

(51) Int. Cl.
*G06F 3/041*   (2006.01)
*G01L 1/16*    (2006.01)
(Continued)

(52) U.S. Cl.
CPC .............. *G06F 3/0414* (2013.01); *G01L 1/16* (2013.01); *G06F 3/047* (2013.01); *G06F 3/0412* (2013.01);
(Continued)

(58) Field of Classification Search
CPC ...... G06F 3/0414; G06F 3/047; G06F 3/0412; G06F 3/0416; H01L 41/0478; H01L 41/1132; H01L 41/193; G01L 1/16
See application file for complete search history.

(56) References Cited

U.S. PATENT DOCUMENTS

2004/0263483 A1* 12/2004 Aufderheide ....... G06F 3/03545
345/173

FOREIGN PATENT DOCUMENTS

JP   H05-248971 A   9/1993
JP   2000-321013 A  11/2000
(Continued)

OTHER PUBLICATIONS

International Search Report in PCT/JP2014/063444 dated Aug. 26, 2014.

*Primary Examiner* — Matthew Sim
(74) *Attorney, Agent, or Firm* — Global IP Counselors, LLP

(57) ABSTRACT

A piezoelectric sensor in which position detection and load detection can be achieved. The piezoelectric sensor includes a piezoelectric layer interposed between the upper electrode and the lower electrode. In the piezoelectric sensor, at least one of the upper electrode and the lower electrode includes a plurality of electrodes patterns.

17 Claims, 21 Drawing Sheets

(51) Int. Cl.
    *H01L 41/193*    (2006.01)
    *H01L 41/047*    (2006.01)
    *H01L 41/113*    (2006.01)
    *G06F 3/047*     (2006.01)
(52) U.S. Cl.
    CPC ........ *G06F 3/0416* (2013.01); *H01L 41/0478* (2013.01); *H01L 41/1132* (2013.01); *H01L 41/193* (2013.01)

(56) References Cited

FOREIGN PATENT DOCUMENTS

| | | |
|---|---|---|
| JP | 2004-125571 A | 4/2004 |
| KR | 10-2010-0022748 A | 3/2010 |
| WO | 2010/095581 A1 | 8/2010 |

\* cited by examiner

PIEZOELECTRIC SENSOR AND PRESSURE DETECTION APPARATUS

CROSS-REFERENCE TO RELATED APPLICATIONS

This U.S. National stage application claims priority under 35 U.S.C. §119(a) to Japanese Patent Application No. 2013-118296, filed in Japan on Jun. 4, 2013, to Japanese Patent Application No. 2013-118297, filed in Japan on Jun. 4, 2013 and to Japanese Patent Application No. 2013-118298, filed in Japan on Jun. 4, 2013, the entire contents of Japanese Patent Application Nos. 2013-118296, 2013-118297 and 2013-118298 are hereby incorporated herein by reference.

BACKGROUND

Field of the Invention

The present invention relates to a piezoelectric sensor that generates piezoelectric signals depending on the load, particularly to a piezoelectric sensor that can detect position to which the load is applied.

Background Information

A piezoelectric sensor that employs piezoelectric layers to detect the applied load has been known. For example, in Japanese Patent Publication 2004-125571, a transparent piezoelectric sensor composed of a transparent pressure sensitive layer and a pair of transparent conductive layers is disclosed.

SUMMARY

While the transparent piezoelectric sensor in Japanese Patent Publication 2004-125571 can detect the applied load, it cannot detect a position to which load is applied within the transparent piezoelectric sensor.

In order to achieve the previously mentioned object, the present invention is configured as follows.

A piezoelectric sensor according to the present invention includes an upper electrode, a lower electrode, and a piezoelectric layer interposed between the upper electrode and the lower electrode. At least one of the upper electrode and the lower electrode includes a plurality of pattern electrodes. It is acceptable that the upper electrode includes a plurality of first pattern electrodes, and the lower electrode includes a plurality of second pattern electrodes extending in the same direction as that of the first pattern electrodes. Alternatively, the upper electrode may include a plurality of first pattern electrodes, and the lower electrode may include a plurality of second pattern electrodes crossing the first pattern electrodes.

The previously mentioned configuration makes it possible to specify the position to which the load is applied, by specifying, among the pattern electrodes, the electrode through which electric charge generated from the piezoelectric layer when the load is applied to the piezoelectric sensor are detected.

A reference electrode may be provided between the upper electrode and the lower electrode. In this case, a first piezoelectric layer may be provided between the upper electrode and the reference electrode, and a second piezoelectric layer may be provided between the lower electrode and the reference electrode.

Accordingly, it is possible to detect the electric charge generated at the first piezoelectric layer and the second piezoelectric layer independently through the upper electrode and the lower electrode.

The first pattern electrodes may include first connecting portions electrically connecting the first electrodes with each other. The second pattern electrodes may include the second electrodes and second connecting portions. The first electrodes are arranged on the piezoelectric layer such that the first electrodes overlap the second electrodes.

Accordingly, it is possible to detect electric charge generated at the piezoelectric layer through the first electrode and second electrode, thus it becomes possible to detect the position to which the load is applied and the load amount.

The first electrodes may be arranged such that the first electrodes overlap the second electrodes via the piezoelectric layer.

Accordingly, the number of positions where the first electrodes and second electrodes intersect each other is increased compared to the above-described case. As a result, the position detection accuracy is improved in the piezoelectric sensor.

The first pattern electrodes may have a strip-shape.

The second pattern electrodes may have a strip-shape.

A width of the first pattern electrodes may become larger as the first pattern electrodes approach a peripheral portion of the piezoelectric layer.

Accordingly, the detection sensitivity of the load is improved at peripheral portions of the piezoelectric layer, where deflection amount is generally small when the load is applied and therefore the detection sensitivity of the load is generally low.

A width of the second pattern electrode may become larger as the second pattern electrode approach a peripheral portion of the piezoelectric layer.

Accordingly, the detection sensitivity of the load is improved at peripheral portions of the piezoelectric layer, where deflection amount is generally small when the load is applied and therefore the detection sensitivity of the load is generally low.

Pitch intervals of the first pattern electrodes may be constant.

Accordingly, while keeping sensitivity at the peripheral portion constant, the detection accuracy of the position where the load is applied is improved.

Pitch intervals of the second pattern electrodes may be constant.

Accordingly, while keeping sensitivity at the peripheral portion constant, the detection accuracy of the position where the load is applied is improved.

The first pattern electrodes may have a concave-convex shape, and a pitch interval of the first pattern electrodes may be designed to be shorter than a length of a shorter diameter of a contact surface formed when input means makes contact with the piezoelectric sensor. Furthermore, the first pattern electrodes adjacent to each other may be arranged such that convex portions and concave portions of the concave-convex shape engage with each other between the first pattern electrodes.

Accordingly, when the piezoelectric sensor and a target make contact with each other, the number of contacts between the first pattern electrodes and the target is increased. As a result, it is possible to detect a load-applied position and load amount more precisely compared to the previously mentioned case.

The second pattern electrode may have a concave-convex shape, and a pitch interval of the second pattern electrodes is designed to be shorter than a length of a shorter diameter of a contact surface formed when input means makes contact with the piezoelectric sensor. Furthermore, the second pattern electrodes adjacent to each other may be arranged such that convex portions and concave portions of the concave-convex shape engage with each other between the second pattern electrodes.

Accordingly, when the piezoelectric sensor and the target make contact with each other, the number of contacts between the second pattern electrodes and the target is increased. As a result, it is possible to detect a load-applied position and load amount more precisely compared to the previously mentioned case.

A pressure detection apparatus according the present invention includes a piezoelectric layer, first electrodes, second electrodes, a first detection unit, and a second detection unit. The first electrodes are laminated on a first main surface of the piezoelectric layer. The first electrodes includes pattern electrodes. The pattern electrodes include an L-shaped reference electrode and L-shaped electrodes. The L-shaped reference electrode is an electrode with an L-shape that is constituted by a combination of two sides. The L-shaped electrodes are electrodes with an L-shape that are arranged inside of the two sides of the L-shaped reference electrode and have a gap with each other in a first direction. End sides of the L-shaped electrodes are arranged on extension lines of end sides of the L-shaped reference electrode.

Accordingly, the numbers of the L-shaped reference electrode and L-shaped electrodes arranged at the positions in the first direction are different from each other depending on the positions in the first direction. In addition, the L-shaped reference electrode and the L-shaped electrodes are connected to an L-shaped reference electrode detection unit and the L-shaped electrode units of the first electrodes. Accordingly, when the load is applied to the piezoelectric layer, the numbers of L-shaped reference electrode detection unit and L-shaped electrode detection units which detect electric charge, are different from each other depending on the positions in the first direction where the load is applied. Accordingly, it is possible to detect the position to which the load is applied in the first direction, by specifying the number of the detection units that detects the electric charge.

In addition, the second electrodes are laminated on a second main surface of the piezoelectric layer. The second electrodes include strip-like electrodes that are arranged in the direction perpendicular to the first direction and cover the pattern electrodes. The second detecting unit includes strip-like electrode detection units independently connected to the strip-like electrodes.

Accordingly, when the load is applied to the piezoelectric layer, it is possible to specify the position in the direction perpendicular to the first direction to which the load is applied, by specifying kinds of the strip-like electrode detection units that detect the electric charge.

Accordingly, it is possible to detect position to which the load is applied by combining position information obtained by the first electrode detection unit and the second electrode detection unit.

A pressure detection apparatus according to the present invention includes a piezoelectric layer, first electrodes, second electrodes, first detection unit, and second detection unit. The first electrodes are laminated on a first main surface of the piezoelectric layer.

The first electrodes include strip-like pattern electrodes composed of strip-like electrodes arranged in a first direction.

The second electrodes include tread portions, rise portions, and a connecting portion. The tread portions are arranged between the strip-like electrodes. The rise portions connect the tread portions with each other. The rise portions cross the strip-like electrodes one by one. The connecting portion connects a start point of the tread portions and an end point of the rise portions.

The first detection unit includes strip-like electrode detection units respectively connected to the strip-like electrodes of the strip-like pattern electrodes. The second detection unit includes a plurality of stepped electrode detection units respectively connected to a plurality of stepped electrodes.

Accordingly, the numbers of the overlaps of the strip-like electrodes and the rise portions are different from each other depending on the positions in the first direction. In addition, the strip-like electrodes are connected to the strip-like electrode detection units. Accordingly, when the load is applied to the piezoelectric layer, the numbers of the strip-like electrode detection units that detect the electric charge are different from each other depending on the positions in the first direction. Accordingly, it is possible to detect the position to which the load is applied in the first direction by specifying the number of the detection units that detect the electric charge.

In addition, the second electrodes are laminated on a second main surface of the piezoelectric layer. The second electrodes include stepped electrodes. The second detection unit includes stepped electrode detection units independently connected to the stepped electrodes.

Accordingly, when the load is applied to the piezoelectric layer, it is possible to detect the position in the direction perpendicular to the first direction by specifying kinds of the stepped electrode detection units that detect the electric charge generated at the piezoelectric layer.

Accordingly, it is possible to detect the position to which the load is applied by combining the position information obtained by the first electrode detection unit and the second electrode detection unit.

The piezoelectric layer may include active piezoelectric portions and inactive piezoelectric portions, and the first pattern electrodes may be laminated on the active piezoelectric portions.

Accordingly, it is possible to prevent the cross-talk phenomenon. As a result, the detection accuracies of the position to which the load is applied and the load amount in the piezoelectric layer are improved.

The piezoelectric layer may include active piezoelectric portions and inactive piezoelectric portions, and the second pattern electrodes may be laminated on the active piezoelectric portions.

Accordingly, it is possible to prevent the cross-talk phenomenon. As a result, the position detection accuracy of the piezoelectric sensor is improved.

The upper electrode may include indium tin oxide or "poly(3, 4-ethylenedioxythiophene)".

Accordingly, since the transparency of the upper electrode becomes higher, it is possible to place the piezoelectric sensor on a display device such as a liquid crystal display and an organic EL display.

The lower electrode may include indium tin oxide or "poly(3, 4-ethylenedioxythiophene)".

Accordingly, since the transparency of the lower electrode becomes higher, it is possible to place a piezoelectric sensor on a display device such as a liquid crystal display and an organic EL display.

The piezoelectric layer may be composed of organic piezoelectric material.

Accordingly, since the flexibility of the piezoelectric layer becomes higher, the bending resistance of the piezoelectric sensor is improved. As a result, it is possible to dispose the above mentioned piezoelectric sensor on an R curved surface and so on.

The organic piezoelectric material may include polyvinylidene fluoride or polylactic acid.

Accordingly, the transparency of the piezoelectric layer becomes higher, it is possible to dispose a piezoelectric sensor on a display device such as a liquid crystal display and an organic EL display.

The piezoelectric layer may be composed of inorganic material.

Accordingly, since the piezoelectric constant is large, the detection accuracy of the load is improved.

The pressure detection apparatus may further include a touch panel provided on the piezoelectric sensor.

Accordingly, even if the load is barely applied to the piezoelectric sensor, it is possible to detect the position of the load.

The touch panel may be a capacitance type touch panel.

Accordingly, the transparency of the entire pressure detection apparatus is improved.

In a piezoelectric sensor according to the present invention, it is possible to detect a position in the piezoelectric sensor.

DESCRIPTION OF EMBODIMENTS

Embodiments according to the present invention will be described below in detail, with reference to figures. The dimensions, materials, shapes, and relative positions of parts or portions described in the embodiments of the present invention are merely described as examples and do not limit the scope of the present invention unless otherwise specified.

1. First Embodiment (1) Entire Structure of the Pressure Detection Apparatus

Figure 1:
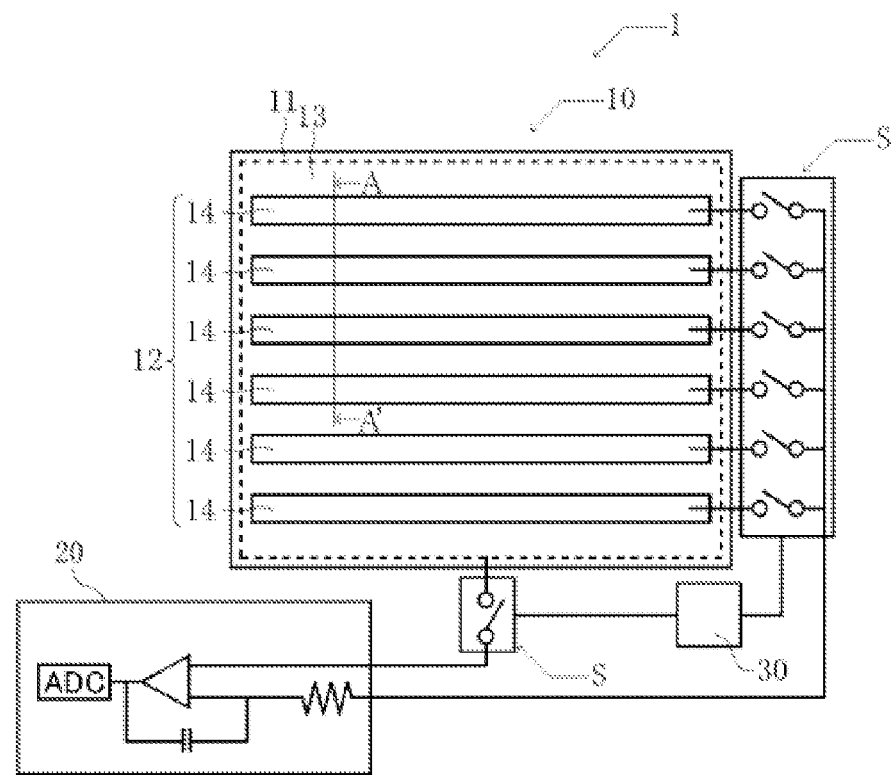
FIG. 1 is a conceptual diagram of the pressure detection apparatus.
Figure 2:
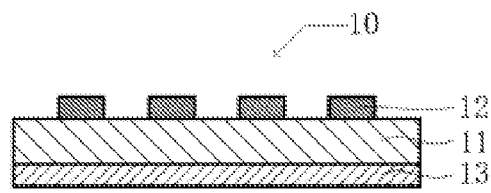
FIG. 2 is an A-A' cross section in FIG. 1.

Referring to FIG. 1 and FIG. 2, the entire structure of the pressure detection apparatus according to the first embodiment of the present invention will be described. FIG. 1 is a schematic diagram of the pressure detection apparatus. FIG. 2 is a cross section of the piezoelectric sensor.

The pressure detection apparatus has functions of detecting amount and position of the applied load.

As shown in FIG. 1, the pressure detection apparatus 1 includes a piezoelectric sensor 10, a detection unit 20, and a controller 30. The piezoelectric sensor 10 is a device that generates electric charge in response to the applied load. The detection unit 20 is a device that detects the electric charge generated in the piezoelectric sensor 10. The controller 30 is a device that controls a switch S provided in the piezoelectric sensor 10. Hereinbelow, the configuration of the pressure detection apparatus 1 will be described in detail.

(2) Piezoelectric Sensor

As shown in FIG. 2, the piezoelectric sensor 10 is composed of a piezoelectric layer 11 that is interposed between the upper electrode 12 and the lower electrode 13. The upper electrode 12 is laminated on an upper surface of the piezoelectric layer 11, and the lower electrode 13 is laminated on a lower surface of the piezoelectric layer 11.

Again as shown in FIG. 1, the upper electrode 12 includes a strip-like first pattern electrodes 14. The first pattern electrodes 14 are arranged in Y-axis direction. The lower electrode 13 extend over the entire surface.

If the load is applied to the piezoelectric sensor 10 having the above configuration, electric charge based on the applied load is generated at the piezoelectric layer 11. The generated electric charge is detected by the detection unit 20 via the first pattern electrodes 14 and the lower electrode 13 which exist in the vicinity of the position to which the load is applied. At this time, the amount of the load applied to the piezoelectric sensor 10 can be specified by measuring the amount of electric charge detected by the detection unit 20. The load position can be specified by the controller 30, in such a way that the controller 30 determines which one of the first pattern electrodes 14 the electric charge detected by the detection unit 20 passes through before the electric charge is detected by the detection unit 20.

(3) Piezoelectric Layer

A material of the piezoelectric layer 11 is inorganic piezoelectric material or organic piezoelectric material, for example.

The inorganic piezoelectric material is barium titanate, lead titanate, lead (Pb) zirconate titanate, potassium niobate, lithium niobate, and lithium tantalate, for example.

The organic piezoelectric material may include fluoride compound or its copolymer, and polymer material including chirality, for example. The fluoride compound or its copolymer may be polyvinylidene fluoride, vinylidene fluoride-tetrafluoroethylene copolymer, or vinylidene fluoride-trifluoroethylene copolymer, for example. The polymer materials having chirality may be PLAS or PDLA, for example.

In addition, when the pressure detection apparatus 1 is used to a display device including a touch panel, it is preferable that the piezoelectric portion be made of a transparent material or thin enough to transmit light sufficiently.

(4) Electrodes

The upper electrode 12 and lower electrode 13 can be formed by a conductive material. The conductive material may include transparent conductive oxide such as Indium-Tin-Oxide (ITO), tin-zinc-oxide (TZO), and so on, and a conductive polymer such as polyethylenedioxythiophene (PEDOT). In this case, the electrodes can be formed with vapor deposition or screen printing, for example.

Alternatively, the conductive material conductive metals such as copper and silver. In this case, the electrodes can be formed with vapor deposition, or metal paste such as copper paste and silver paste.

Furthermore, the conductive material may include a binder and conductive materials, such as carbon nanotube, metal grain, and metal nanofiber, disbursed therein.

(5) Detection Unit

As shown in FIG. 1, the detection unit 20 has two inputs. One input is connected to the upper electrode 12. Another input is connected to the lower electrode 13.

According to the above-described configuration, the detection unit 20 can detect electric charge generated between the upper electrode 12 and the lower electrode 13 (i.e., between the both main surfaces of the piezoelectric layer 11) when the piezoelectric layer 11 is pressed. As the detection unit 20, a detection device as a combination of an AD convertor and an amplifier can be used.

(6) Controller

The controller 30 is connected to a switch S that connects the upper electrode 12 and detection unit 20, and a switch S that connects the lower electrode 13 and the detection unit 20. The controller 30 has a function of outputting ON-OFF switching signals to the switches S.

The controller 30 can be, for example, incorporated in a drive system of the pressure detection apparatus 1. The drive system may be a microcomputer that includes a CPU (Central Processing Unit), memory units, and an interface for driving the piezoelectric sensor, and so on. Alternatively, the drive system may be integrated in one IC chip as a custom IC.

Alternatively, the above-described function of the controller may be realized by causing the CPU or the custom IC to execute a program stored in the memory units of the microcomputer or the custom IC.

If the pressure detection apparatus 1 has the above-described configuration, the controller 30 can detect the electric charge generated between the upper electrode 12 and the lower electrode 13. Accordingly, the position to which the load is applied and the amount of the applied load can be calculated from the detected electric charge. Even if the load is applied to plural positions, each position to which the load is applied and the amount of the applied load at each position can be detected. In other words, the pressure detection apparatus 1 has the configuration in which the multi-force detection can be achieved.

2. Second Embodiment

Although the lower electrode 13 extends over the entire surface and does not have a pattern shape in the first embodiment, the lower electrode 13 may have second pattern electrodes 15.

Figure 3:
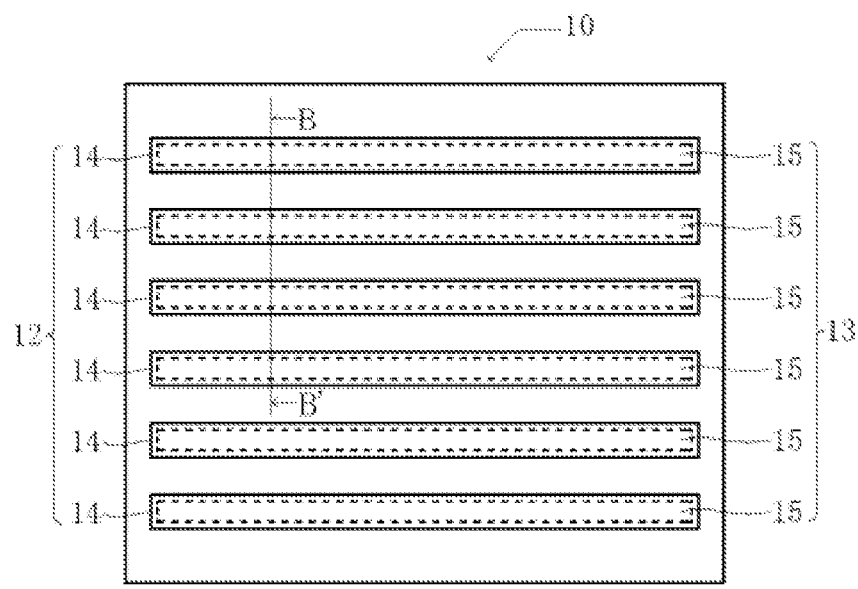
FIG. 3 is a plane view of the piezoelectric sensor.
Figure 4:
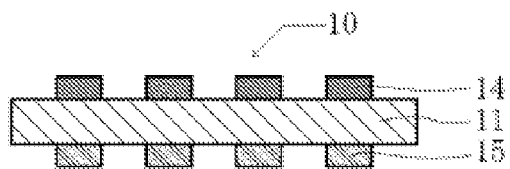
FIG. 4 is a B-B' cross section in FIG. 3.

FIG. 3 is a plane view of the piezoelectric sensor according to a second embodiment. FIG. 4 is a B-B' cross section in FIG. 3.

As shown in FIG. 3, in addition previously mentioned one, the lower electrode 13 includes a strip-like second pattern electrodes 15. The first pattern electrodes 14 and the second pattern electrodes 15 are arranged in Y-axis direction. The first pattern electrodes 14 are laminated over the second pattern electrodes 15 via the piezoelectric layer 11. As shown in FIG. 3 and, FIG. 4, the first pattern electrodes 14 laminated on the piezoelectric layer 11 are laminated so as to extend along the shape of the second pattern electrodes 15.

If the load is applied to the piezoelectric sensor 10 having the above configuration, the electric charge is generated in the piezoelectric layer 11 in response to the applied load. The generated electric charge is detected by the detection unit 20 through the first pattern electrodes 14 and the second pattern electrodes 15 existing in the vicinity of the position to which the load is applied. At this time, it is possible to specify the amount of load applied to the piezoelectric sensor 10 by measuring the amount of the electric charge detected by the detection unit 20. It is possible to specify the load position by detection by the controller 30, among the first pattern electrodes 14 and the second pattern electrodes 14, which one of first pattern electrodes 14 and which one of the second pattern electrodes 15 the electric charge generated by the detection unit 20 passes through before the electric charge is detected by the detection unit 20. Accordingly, it is possible to detect the position of the portions to which the load is applied and the amount of the applied load.

According to the previously mentioned configuration, since the lower electrode 13 is patterned like the upper electrode 12, it is possible to detect the position and the load precisely compared to the previous embodiment.

Although the first pattern electrodes 14 and the second pattern electrodes 15 are arranged on the piezoelectric layer 11 in Y-axis direction in the previously mentioned example, the first pattern electrodes 14 and the second pattern electrodes 15 may be arranged in X-axis direction.

3. Third Embodiment

The method of laminating the first pattern electrodes 14 and the second pattern electrodes 15 is not limited to the case in which the first pattern electrodes 14 are laminated on the piezoelectric layer 11 along the shape of the second pattern electrodes 15. Another arrangement method will be described below.

Figure 5:
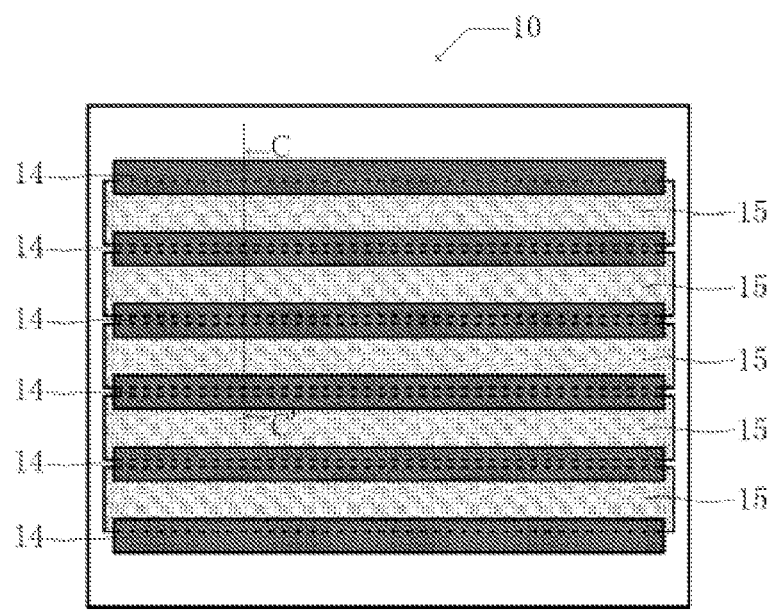
FIG. 5 is a plane view of the piezoelectric sensor.
Figure 6:
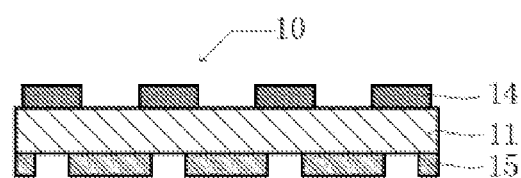
FIG. 6 is a C-C' cross section in FIG. 5.

FIG. 5 is a plane view of the piezoelectric sensor according to the third embodiment. FIG. 6 is a C-C' cross section in FIG. 5.

As shown in FIG. 5, the first pattern electrodes 14 are laminated on the piezoelectric layer 11, extending over a plurality of the second pattern electrodes 15. The previously mentioned configuration makes it possible to, as shown in FIG. 6, increase the number of the first pattern electrodes 14 over the second pattern electrodes 15 via the piezoelectric layer 11 (in the second embodiment, as shown in FIG. 4, the number of the overlapped portions between the first pattern electrodes 14 and the second pattern electrodes 15 is four. In contrast, in the third embodiment, as shown in FIG. 6, the number of the overlapped portions between the first pattern electrodes 14 and the second pattern electrodes 15 becomes eight). As a result, since the number of the detection units that detect the input means is increased, the position detection accuracy and load detection accuracy are improved when the input means get into contact with the piezoelectric sensor 10.

4. Fourth Embodiment

Although the length in the width direction of the first pattern electrodes 14 and the second pattern electrodes 15 are constant in the first to third embodiments, the length may become longer as approaching peripheral portions of the piezoelectric layer 11.

Figure 7:
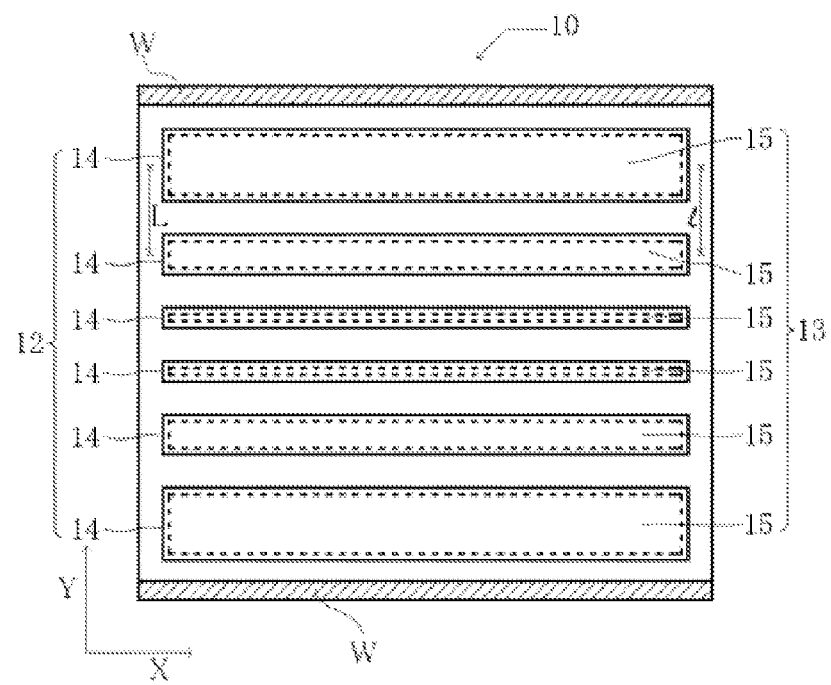
FIG. 7 is a plane view of the piezoelectric sensor.
Figure 8:
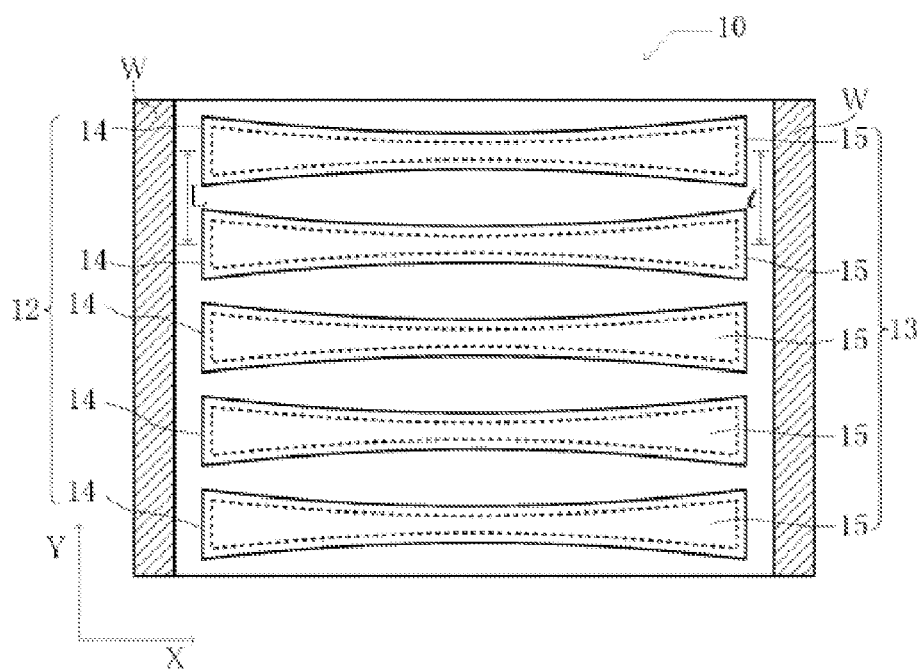
FIG. 8 is a plane view of the piezoelectric sensor.
Figure 9:
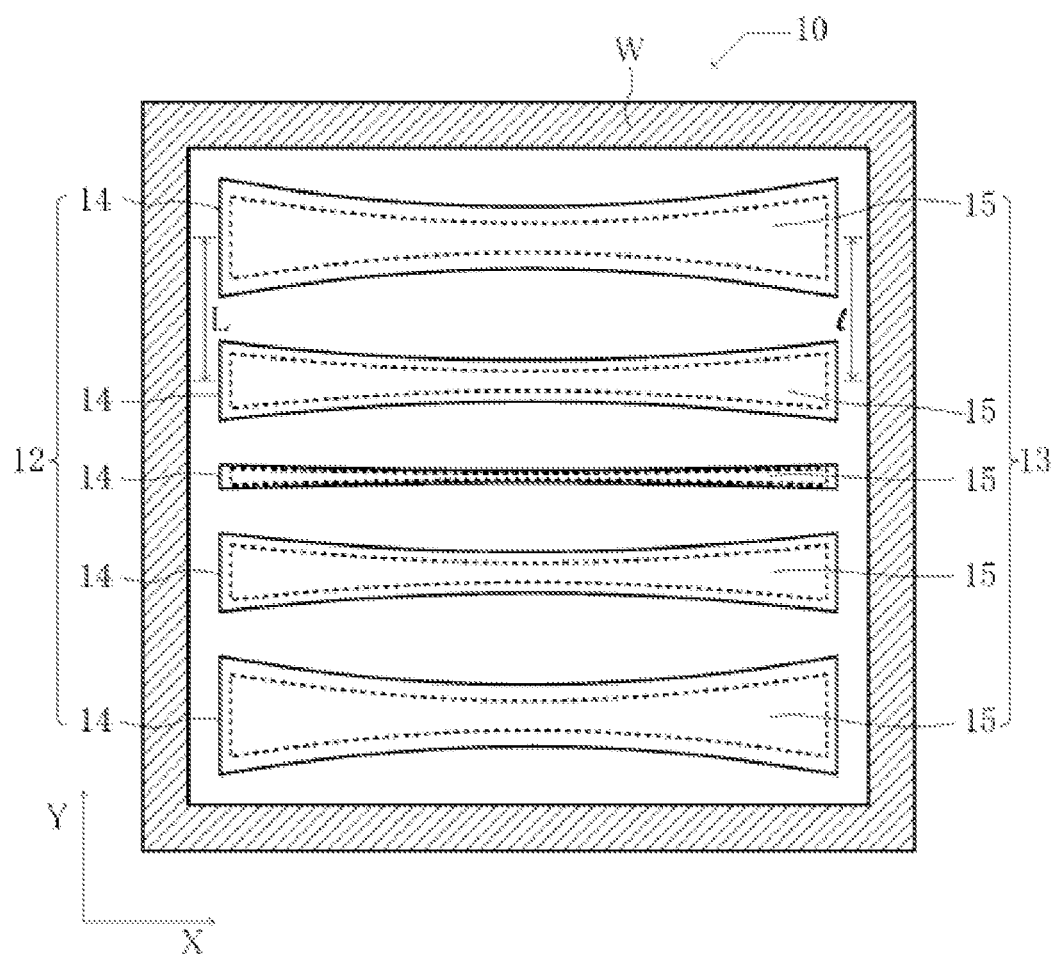
FIG. 9 is a plane view of the piezoelectric sensor.

FIG. 7, FIG. 8, and FIG. 9 are plane views of the piezoelectric sensor according to the third embodiment.

As shown in FIG. 7, the upper electrode 12 includes first pattern electrodes 14 arranged side by side in Y-axis direction. At both ends of the piezoelectric sensor 10 in Y-axis direction, fixing members W are provided for fixing the piezoelectric sensor 10. The fixing member W is formed of an adhesive member or a fixed frame. In this case, the upper electrode 12 is configured to arrange the first pattern electrodes 14 whose width of the electrodes becomes wider as they approach the both ends. This applies to the second pattern electrodes 15 (dotted line portions in FIG. 7) of the lower electrode 13.

As shown in FIG. 8, at the both ends of the piezoelectric sensor 10 in X-axis direction, fixing members W may be provided for fixing the piezoelectric sensor 10. In this case, the upper electrode 12 include first pattern electrodes 14 having a constricted shape whose width of the electrodes becomes wider as they approach the both ends. This applies to the second pattern electrodes 15 (dotted line portion in FIG. 8) of the lower electrode 13.

As shown in FIG. 9, at a peripheral portion of the piezoelectric sensor 10, fixing members W may be provided for fixing the piezoelectric sensor 10. In this case, the upper electrode 12 may include a structure as a combination of the previously mentioned structures. In other words, the upper electrode 12 includes the first pattern electrodes 14 having a constricted shape whose electrode width becomes wider as they approach the both ends in X-axis direction, and the first electrodes pattern electrodes 14 may have width of the electrodes which becomes wider as they approach both ends in Y-axis direction. This applies to the second pattern electrodes 15 (dotted line portions in FIG. 9).

As previously mentioned, if the piezoelectric sensor 10 is fixed by the fixing member W and so on, when the load is applied to the piezoelectric sensor 10, it becomes unlikely that the detection force is conveyed to the portion where the fixing members W are provided or the portion around it. Accordingly, it becomes difficult to detect the load at the previously mentioned portions.

In the fourth embodiment, in a case in which the fixing members W are provided at both ends in Y-axis direction of the piezoelectric sensor 10, the upper electrode 12 is configured to have first pattern electrodes 14 whose electrode width becomes larger as they approach the both ends in Y-axis direction. In a case in which the fixing members W are provided at both ends in X-axis direction of the piezoelectric sensor 10, the upper electrode 12 is configured to have the first pattern electrodes 14 having a constricted shape whose electrode width becomes larger as they approach the both ends in X-axis direction. Accordingly, it is possible to improve physical detection sensitivity of the electrodes, thereby detecting the load at or around the fixing members W, where it is difficult to detect the load.

Furthermore, in the fourth embodiment, the first pattern electrodes 14 may be arranged on the piezoelectric layer 11 so as to make pitch intervals L between the first pattern electrodes 14 constant. The second pattern electrodes 15 may also be arranged on the piezoelectric layer 11 so as to make pitch intervals l between the second pattern electrodes 15. This configuration allows the first pattern electrodes 14 and the second pattern electrodes 15 to be arranged on the piezoelectric layer 11 equidistantly, thus it becomes possible to detect the position precisely in addition to the previously mentioned effects. It should be noticed that the pitch interval means a distance between the central portion of the electrode and the central portion of the adjacent electrode.

5. Fifth Embodiment

As long as the first pattern electrodes 14 and the second pattern electrodes 15 extend in the same direction, other structures are not limited. Accordingly, the shapes of the first pattern electrodes 14 and the second pattern electrodes 15 are not particularly limited to the strip-like shape. Below, the shape of the electrodes will be described.

Figure 10:
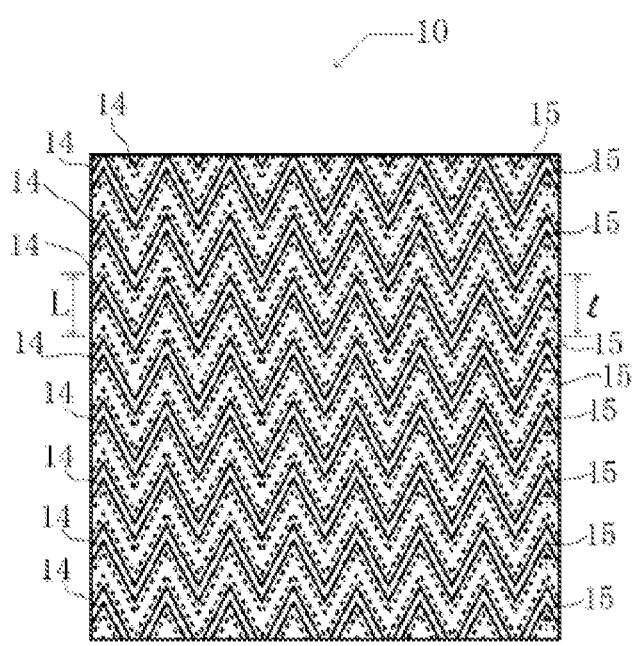
FIG. 10 is a plane view of the piezoelectric sensor.

FIG. 10 is a plane view of the piezoelectric sensor according to the fifth embodiment.

As shown in FIG. 10, the first pattern electrodes 14 have a concave-convex shape. The concave-convex shape is composed of repeating structure of the convex portions and the concave portions. The first pattern electrodes 14 are arranged on the piezoelectric layer 11 such that, in the first pattern electrodes 14, the convex portions and concave portions are engaged with each other between the electrodes adjacent to each other.

A pitch length L of the first pattern electrode is designed to be shorter than a length of a shorter diameter of a contact surface when input means (for example, a finger or a stylus pen) gets into contact with the piezoelectric sensor 10. If the input means is a finger, the pitch length L of the convex portion is 1 mm to 16 mm. If the input means is a stylus pen, the pitch length L of the convex portion is 0.5 mm to 4 mm.

Accordingly, when the input means makes contact with the piezoelectric sensor 10, the input means makes contact with more first pattern electrodes 14 than a case in which the first pattern electrodes 14 have a strip-shape. As a result, the more precise position detection and load detection can be achieved.

The second pattern electrodes 15 may also have a concave-convex shape. In this case, it is preferable that a pitch length l of the convex portions of the second pattern electrodes 15 is designed to be shorter than the length of the shorter diameter of the contact surface when the input means gets into contact with the pressure sensor 10.

According to the previously mentioned configuration, when the input means gets into contact with the piezoelectric sensor 10, the input means makes more contacts with the first pattern electrodes 14 and the second pattern electrodes 15. Accordingly, it becomes possible to detect the position and load more precisely.

6. Sixth Embodiment

Other pattern shape of the first pattern electrodes 14 and the second pattern electrodes 15 will be described below.

Figure 11:
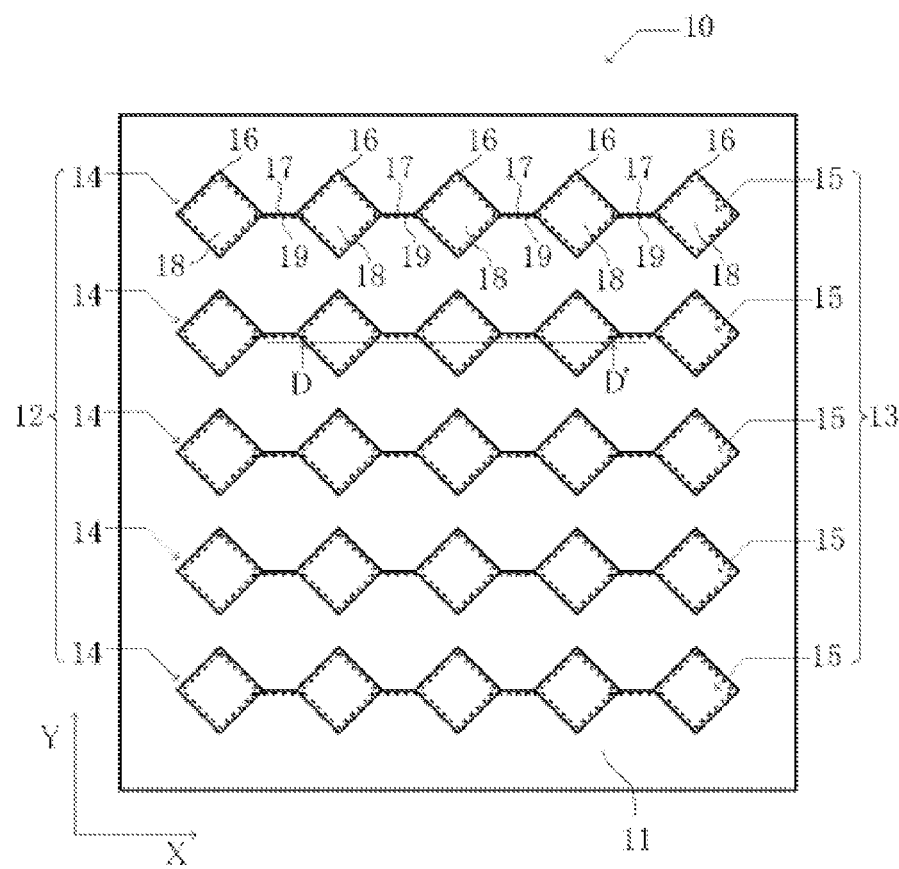
FIG. 11 is a plane view of the piezoelectric sensor.
Figure 12:
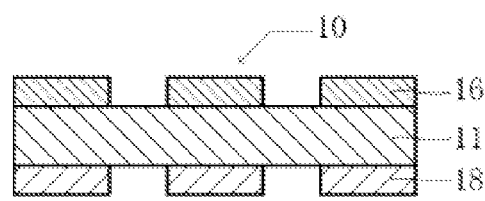
FIG. 12 is a D-D' cross section FIG. 11.

FIG. 11 is a plane view of the piezoelectric sensor according to the sixth embodiment. FIG. 12 is a D-D' cross section in FIG. 11.

As shown in FIG. 11, the first pattern electrodes 14 include first electrodes 16 arranged in X-axis direction, and first connecting portions 17 electrically connecting the first electrodes 16 with each other.

The second pattern electrodes 15 includes second electrodes 18 (FIG. 11: rhombus-shaped dotted line portions) arranged in X-axis direction, and second connecting portions 19 (FIG. 11: dotted line portions) electrically connecting the second electrodes 18 with each other. Although the shape of the first electrodes 16 and the second electrodes 18 is shown as a rhombic shape in FIG. 9, they may have a polygonal shape such as triangle and rectangle, a circular shape, or an elliptic shape.

As shown in FIG. 11 and FIG. 12, the first electrodes 16 are laminated on the piezoelectric layer 11 along the shape of the second electrodes 18. Accordingly, when the input means (for example, a finger or a stylus pen) gets into contact with the first electrodes 16, the electric charge generated at the piezoelectric layer 11 is detected by the detection unit 20 via the first electrodes 16 and the second electrodes 18. At this time, it is possible to specify the amount of the load applied to the piezoelectric sensor 10, by measuring the amount of the electric charge by the detection unit 20. It is possible to specify the position to which the load is applied by detecting by the controller 30, among the first pattern electrodes 14 and the second pattern electrodes 15, which one of the first pattern electrodes 14 and which one of the second pattern electrodes 15 the electric charge detected by detection unit 20 passes through.

7. Seventh Embodiment

The method of laminating the first pattern electrodes 14 and the second pattern electrodes 15 is not limited to a case in which the first electrodes 16 are laminated on the piezoelectric layer 11 along the shape of the second electrodes 18. Another arrangement method will be described below. Since the basic structure is the same as that of the sixth embodiment, only the difference will be described.

Figure 13:
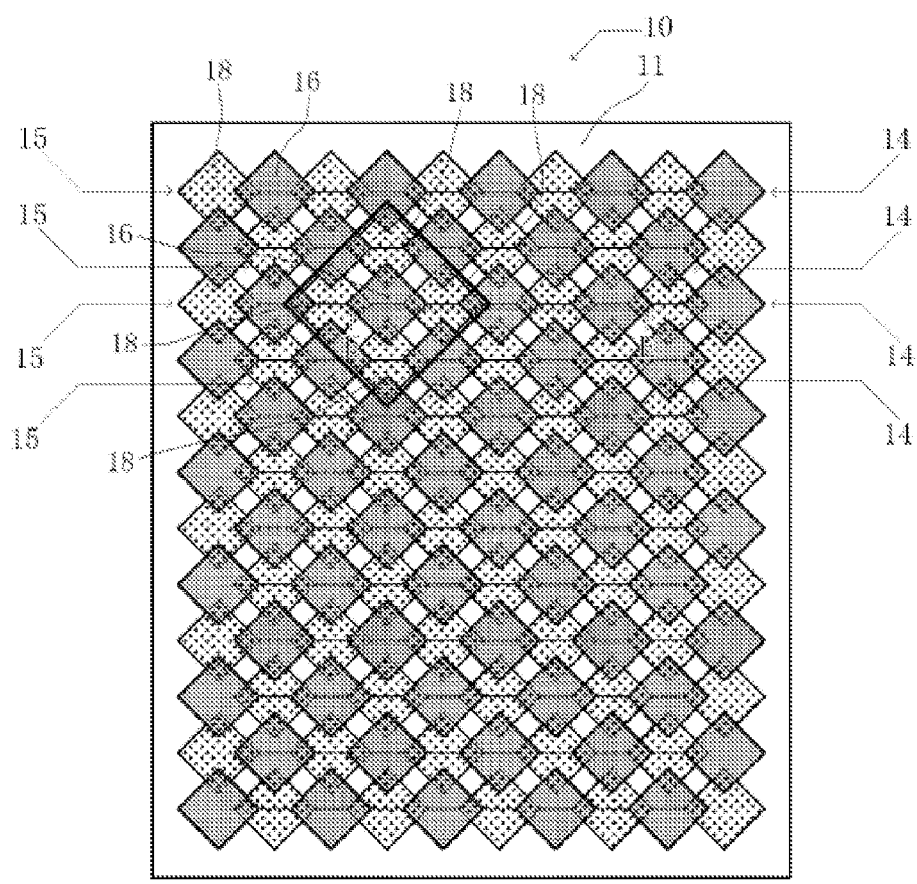
FIG. 13 is a plane view plane view of the piezoelectric sensor.
Figure 14:
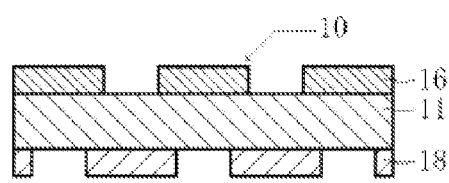
FIG. 14 is a cross section FIG. 13E-E'.

FIG. 13 is a plane view of the piezoelectric sensor according to the seventh embodiment. FIG. 14 is an E-E' cross section in FIG. 13.

As shown in FIG. 13, the first pattern electrodes 14 are arranged in Y-axis direction. The first pattern electrodes 14 are disposed on the piezoelectric layer 11 such that the first pattern electrodes 14 are engaged with each other. The second pattern electrodes are also disposed on the piezoelectric layer 11 such that the second pattern electrodes 15 adjacent to each other are engaged with each other.

In the previously mentioned structure, the first electrodes 16 are arranged so as to extend over four second electrodes 18 arranged on four sides.

If the piezoelectric sensor 10 is configured as previously mentioned, the number of the first electrodes 16 laminated on the second electrodes 18 increases (the number of the overlapped portions between the first electrodes 16 and the second electrodes 18 is three in the sixth embodiment as shown in FIG. 12, on the other hand, the number is six in the seventh embodiment as shown in FIG. 14). As a result, since the number of detection positions increases, when the input means gets into contact with the piezoelectric sensor 10, the position detection accuracy and load detection accuracy are improved.

Furthermore, as previously mentioned, since the first pattern electrodes 14 are arranged to engage with each other, electrodes are placed all over a surface of the piezoelectric layer 11. This will be achieved if the second pattern electrodes 15 are arranged so as to engage with each other. As a result, it is unlikely to see pattern shapes of the first pattern electrodes 14 and the second pattern electrodes 15 in the piezoelectric sensor 10.

8. Eighth Embodiment

The piezoelectric layer 11, not only the upper electrode 12 and the lower electrode 13, may also be patterned so as to have active portions and inactive portions.

Figure 15:
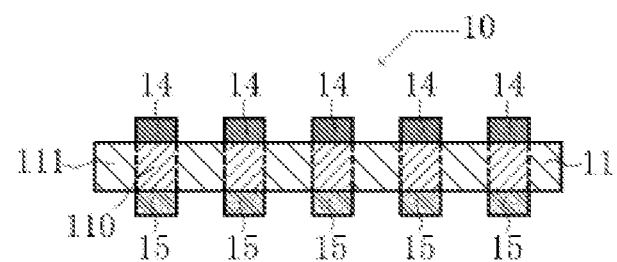
FIG. 15 is a plane view of the piezoelectric sensor.

FIG. 15 is a cross section of the piezoelectric sensor according to the eighth embodiment.

As shown in FIG. 15, the piezoelectric layer 11 includes active piezoelectric portions 110 and inactive piezoelectric portions 111. The active piezoelectric portions 110 are portions where the electric charge is generated when the load is applied to the piezoelectric sensor 10. In contrast, the inactive piezoelectric portions 111 are portions where the electric charge is not generated even if the load is applied.

In an example of FIG. 15, first pattern electrodes 14 and second pattern electrodes 15 are disposed on an upper side and a lower side of the active piezoelectric portion 110. This configuration prevents the generated electric charge from leaking around the first pattern electrodes 14 and going into other first pattern electrodes 14 (i.e., preventing the crosstalk phenomenon). As a result, the position detection accuracy and load detection accuracy are improved. In the previously mentioned structure, although an example was described in which the first pattern electrodes 14 and the second pattern electrodes 15 are directly laminated on the active piezoelectric portion 110, an insulating material such as adhesive and a film may be laminated between the active piezoelectric portions 110 and the first pattern electrodes 14, or between the active piezoelectric portions 110 and the second pattern electrodes 15.

9. Ninth Embodiment

Although the configuration in which the piezoelectric layer is interposed between the upper electrode and the lower electrode was described in the previously mentioned embodiments, a reference electrode may be provided between the upper electrode and the lower electrode.

Figure 16:
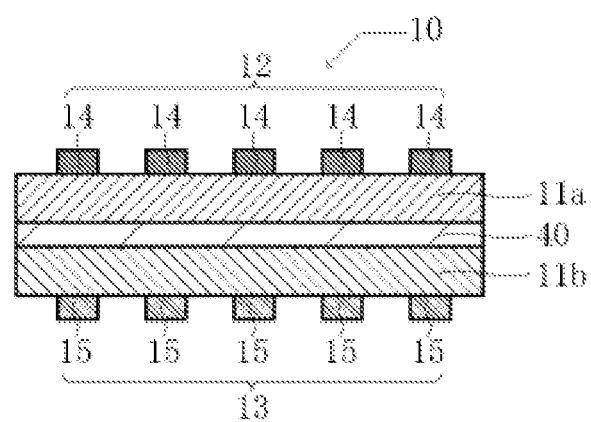
FIG. 16 is a plane view of the piezoelectric sensor.

FIG. 16 is a cross section of the piezoelectric sensor according to the ninth embodiment.

As shown in FIG. 16, the piezoelectric sensor 10 according to the ninth embodiment includes a reference electrode 40 between the upper electrode 12 and the lower electrode 13. A first piezoelectric layer 11a is provided between the upper electrode 12 and the reference electrode 40. A second piezoelectric layer 11b is provided between the lower electrode 13 and the reference electrode 40. Materials of the first piezoelectric layer 11a and the second piezoelectric layer 11b are the same as that of the piezoelectric layer 11. A material of the reference electrode 40 is the same as those of the upper electrode 12 and the lower electrode 13.

If the reference electrode 40 is provided between the upper electrode 12 and the lower electrode 13, it is possible to detect the electric charge generated in the first piezoelectric layer 11a and the second piezoelectric layer 11b by the upper electrode 12 and the lower electrode 13 independently. As a result, it becomes easy to design the detecting circuit.

10. Tenth Embodiment

Although the direction in which the first pattern electrodes 14 are arranged the direction in which the second pattern electrodes 15 are arranged are the same in the second embodiment, the direction in which the first pattern electrodes 14 are arranged and the direction in which the second pattern electrodes 15 are arranged may cross each other.

Figure 17:
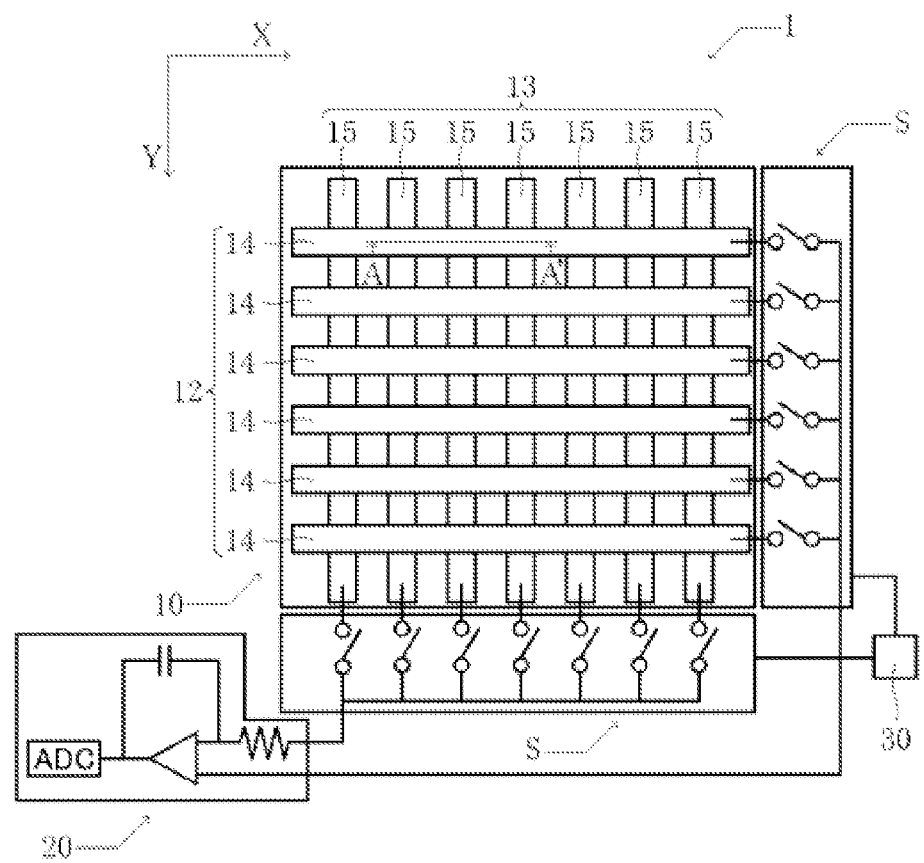
FIG. 17 is a conceptual diagram of the pressure detection apparatus.
Figure 18:
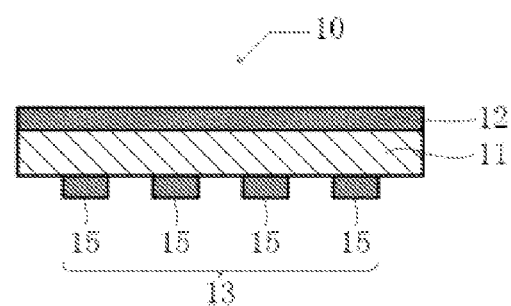
FIG. 18 is an A-A' cross section in FIG. 17.

FIG. 17 is a schematic diagram of the pressure detection apparatus according to the tenth embodiment. FIG. 18 is an A-A' cross section in FIG. 17.

As shown in FIG. 17, the pressure detection apparatus 1 according to the tenth embodiment also includes a piezoelectric sensor 10, a detection unit 20, and a controller 30. The piezoelectric sensor 10 is a device that generates electric charge in response to the applied load. The detection unit 20 is a device that detects the electric charge generated at the piezoelectric sensor 10. The controller 30 is a device that controls switches S provided in the piezoelectric sensor 10.

As shown in FIG. 17, the upper electrode 12 according to the tenth embodiment includes strip-like first pattern electrodes 14. The first pattern electrodes 14 are arranged in Y-axis direction. The lower electrode 13 according to the tenth embodiment include strip-like second pattern electrodes 15, too. The different point from the second embodiment is that the second pattern electrodes 15 in the tenth embodiment are arranged in X-axis direction.

If the load is applied to the piezoelectric sensor 10, the electric charge is generated in response to the applied load. The generated electric charge is detected by the detection unit 20 through the first pattern electrodes 14 and the second pattern electrodes 15 which exist in the vicinity of a position to which the load is applied. At this time, it is possible to specify the amount of the applied load in the piezoelectric sensor 10 by measuring the amount of the electric charge detected by the detection unit 20. It is possible to specify the position to which the load is applied by detecting by the controller 30, among the first pattern electrodes 14 and the second pattern electrodes 15, which one of the first pattern electrodes 14 and which one of the second pattern electrodes 15 the electric charge detected by the detection unit 20 passes though.

Although an example was described in which the first pattern electrodes 14 arranged in Y-axis direction of the piezoelectric layer 11, and the second pattern electrodes 15 are arranged in X-axis direction in the tenth embodiment, the arrangement position of the first pattern electrodes 14 and the second pattern electrodes 15 may be exchanged.

11. Eleventh Embodiment

Although length in the width direction of the first pattern electrodes 14 and the second pattern electrodes 15, whose arrangement directions cross each other, is constant in the tenth embodiment, the length may become wider as they approach peripheral portions of the piezoelectric layer 11.

Figure 19:
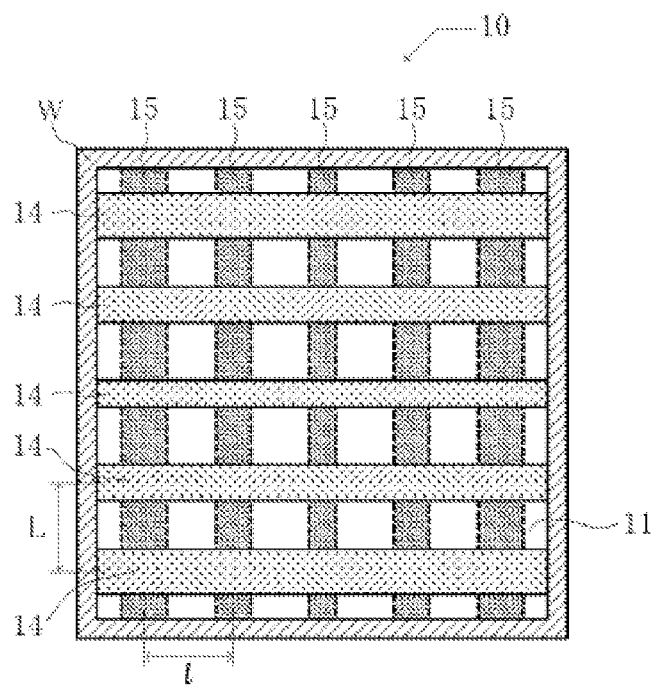
FIG. 19 is a plane view of the piezoelectric sensor.

FIG. 19 is a plane view of the piezoelectric sensor in the eleventh embodiment.

As shown in FIG. 19, on peripheral portion of the piezoelectric sensor 10, a fixing members W are provided for fixing the piezoelectric sensor 10. The fixing member W is an adhesive member or a fixed frame. In this case, the first pattern electrodes 14, whose electrode width becomes wider as they approach the peripheral portions of the piezoelectric sensor 10, may be disposed. This applies to the second pattern electrodes 15.

If the piezoelectric sensor 10 is fixed by the fixing members W and so on, when the load is applied to the piezoelectric sensor 10, deflection force is unlikely to be conveyed to a portion where the fixing members W are provided or portions around it. Accordingly, it is difficult to detect the load at the previously mentioned portions.

In the eleventh embodiment, the electrodes whose electrode width becomes wider as they approach the portions where the fixing member W is provided, thus the physical detection sensitivity is improved. As a result, it becomes possible to detect the load around the fixing members W, where it is difficult to detect the load.

The first pattern electrodes 14 are arranged on an upper surface of the piezoelectric layer 11 such that pitch intervals L of the first pattern electrodes 14 are constant. The second pattern electrodes 15 are arranged on a lower surface of the piezoelectric layer 11 such that pitch intervals 1 of the second pattern electrodes 15 are constant. This configuration makes it possible to arrange the first pattern electrodes 14 and the second pattern electrodes 15 on the piezoelectric layer 11 equidistantly, thus it becomes possible to perform the precise position detection compared to the previously mentioned case.

12. Twelfth Embodiment

Since the first pattern electrodes 14 and the second pattern electrodes 15, whose arrangement directions cross each other, only have to have overlapped portions via the piezoelectric layer 11, the shapes of the first pattern electrodes 14 and the second pattern electrodes 15 are not particularly limited to strip-shape.

Figure 20:
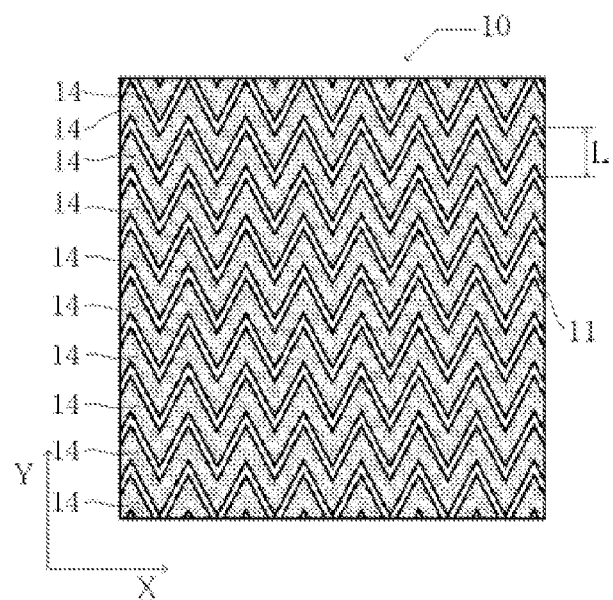
FIG. 20 is a plane view of the piezoelectric sensor.

FIG. 20 is a plane view of the piezoelectric sensor according to the twelfth embodiment.

As shown in FIG. 20, the first pattern electrodes 14 have a concave-convex shape. This concave-convex shape includes repeating structure of the convex portions and the concave portions. The convex portions and the concave portions are arranged so as to engage with each other between the first pattern electrodes 14 adjacent to each other.

A pitch length L of the first pattern electrodes 14 is designed to be shorter than the length of the shorter diameter of the contact surface when input means (for example, a finger and a stylus pen) gets into contact with the piezoelectric sensor 10. If the input means is a finger, the pitch length L of the convex portions is 1 mm to 16 mm. If the input means is a stylus pen, the pitch length L of the convex portions is 0.5 mm to 4 mm.

Accordingly, when the input means and the pressure sensor get into contact with each other, compared to a case in which the shape of the first pattern electrodes 14 is strip-like, the input means gets into contact with more first pattern electrodes 14. As a result, compared to the previously mentioned case, it becomes possible to perform position detection and load detection more precisely.

In the previously mentioned case, the second pattern electrodes 15 may be arranged below the first pattern electrodes 14 via the piezoelectric layer 11, and along the shape of the first pattern electrodes 14.

According to the previously mentioned configuration, when the input means gets into contact with the piezoelectric sensor 10, the input means makes more contacts with the first pattern electrodes 14 and the second pattern electrodes 15. Accordingly, it becomes possible to detect position and load more precisely.

13. Thirteenth Embodiment

Other pattern shapes of the first pattern electrodes 14 and the second pattern electrodes 15, whose arrangement directions cross each other, will be described below.

Figure 21:
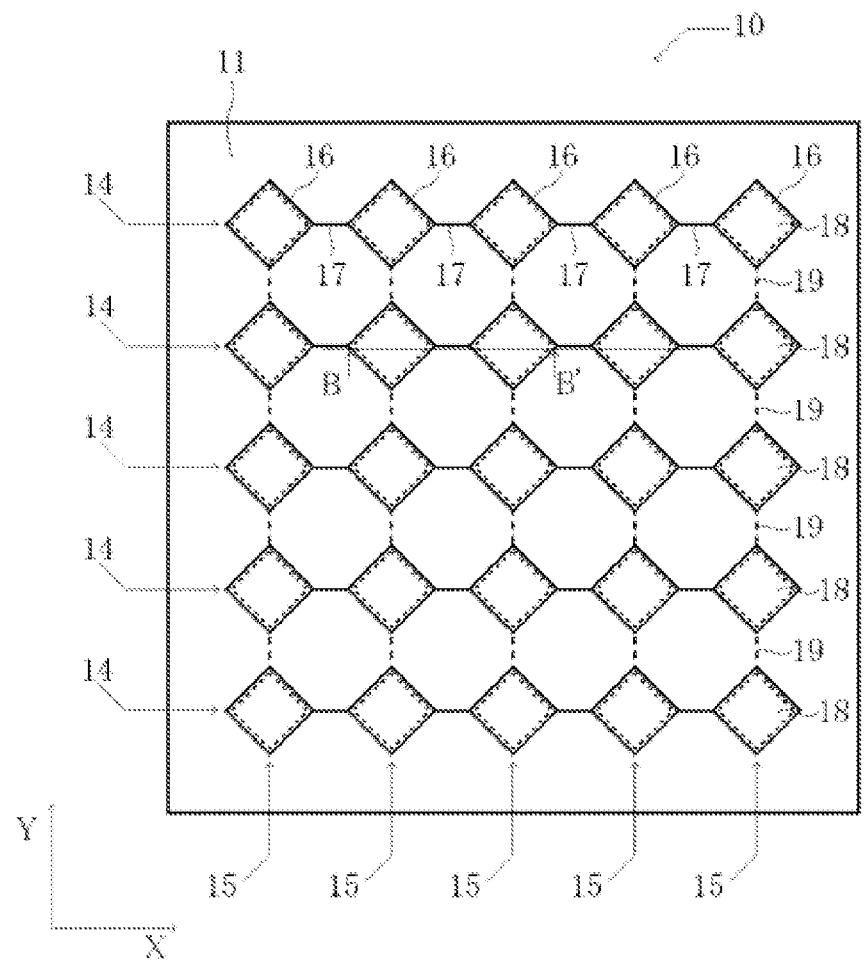
FIG. 21 is a plane view of the piezoelectric sensor.
Figure 22:
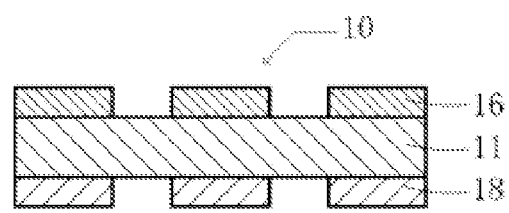
FIG. 22 is a B-B' cross section in FIG. 21.

FIG. 21 is a plane view of the piezoelectric sensor according to the thirteenth embodiment. FIG. 22 is a B-B' cross section in FIG. 21.

As shown in FIG. 21, the first pattern electrodes 14 includes first electrodes 16 arranged in X-axis direction, and first connecting portions 17 electrically connecting the first electrodes 16 with each other.

The second pattern electrodes 15 includes second electrodes 18 (FIG. 21: rhombus-shaped dotted line portions) arranged in Y-axis direction, and second connecting portions 19 (FIG. 21: dotted line portions) electrically connecting the second electrodes 18 with each other. Although the shapes of the first electrodes 16 and the second electrodes 18 are shown as rhombic shape in FIG. 21, the shape may be polygonal such as triangle and rectangle, circular or elliptic.

Furthermore, as shown in FIG. 21 and FIG. 22, the first electrodes 16 are laminated on the piezoelectric layer 11 along the shape of the second electrodes 18. Accordingly, when the input means (for example, a finger or a stylus pen) gets into contact with the first electrodes 16, the electric charge generated at the piezoelectric layer 11 is detected by detection unit 20 via the first electrodes 16 and the second electrodes 18. It is possible to detect the contact position by specifying by the controller 30, which one of the first pattern electrodes 14 and which one of the second pattern electrodes 15 the detected electric charge passes through. It is possible to detect the amount of the load by specifying the amount of the electric charge detected by the detection unit 20.

14. Fourteenth Embodiment

The method of laminating the first pattern electrodes 14 and the second pattern electrodes 15 whose arrangement directions cross each other is not limited to a case in which the first electrodes 16 are laminated on the piezoelectric layer 11 along the shape of the second electrodes 18. Another arrangement method will be described below.

Figure 23:
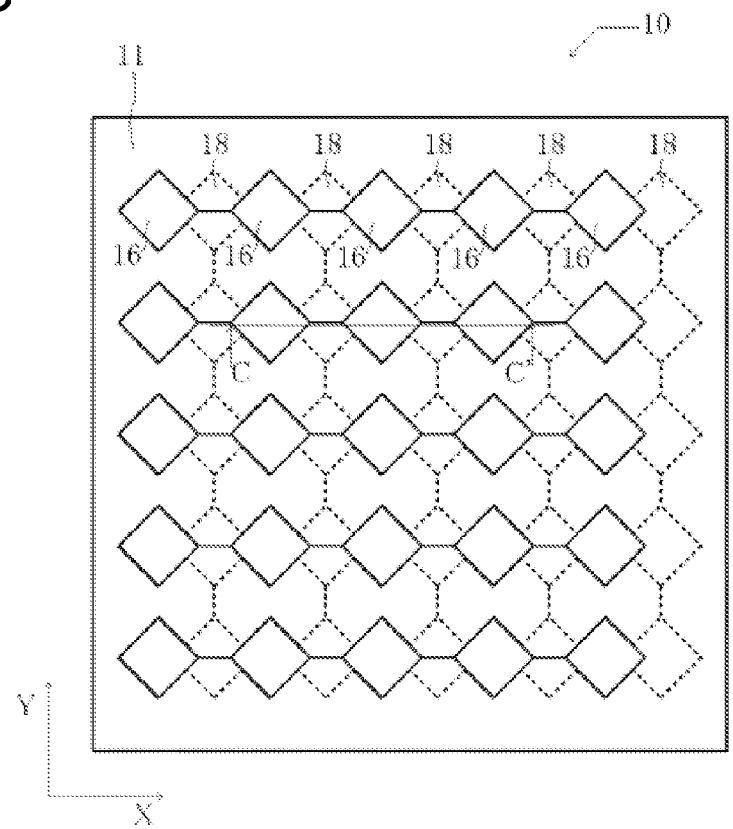
FIG. 23 is a plane view of the piezoelectric sensor.
Figure 24:
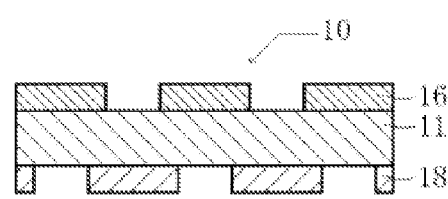
FIG. 24 is a C-C' cross section in FIG. 23.

FIG. 23 is a plane view of the piezoelectric sensor according to the fourteenth embodiment. FIG. 24 is a C-C' cross section in FIG. 23.

As shown in FIG. 23, the first electrodes 16 is laminated on the piezoelectric layer 11, extending over a plurality of the second electrodes 18. According to the previously mentioned configuration, the number of the overlapped potions between the first electrodes 16 and the second electrodes 18 is increased compared to a case of the thirteenth embodiment. As a result, the position detection accuracy and load detection accuracy are improved when the input means makes contact with the piezoelectric sensor 10.

15. Fifteenth Embodiment

Even in an example of the arrangement directions crossing each other, not only the upper electrode 12 and the lower electrode 13, but the piezoelectric layer 11 may also be patterned to have active portions and inactive portions.

Figure 25:
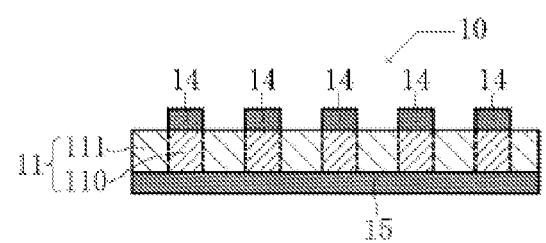
FIG. 25 is a cross section of the piezoelectric sensor.
Figure 26:
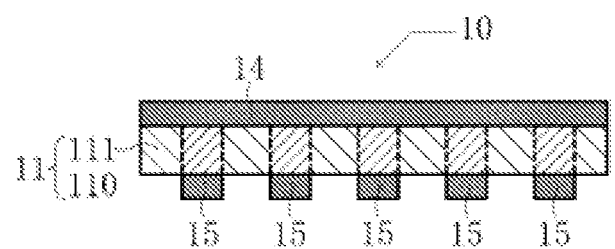
FIG. 26 is a cross section of the piezoelectric sensor.

FIG. 25 and FIG. 26 are cross sections of the piezoelectric sensor according to the fifteenth embodiment.

As shown in FIG. 25, the piezoelectric layer 11 includes active piezoelectric portions 110 and inactive piezoelectric portion 111.

The active piezoelectric portion 110 are portions where the electric charge is generated when the load is applied to the piezoelectric sensor 10. In contrast, the inactive piezoelectric portions 111 are portions where the electric charge is not generated even if the load is applied.

In an example of FIG. 25, the first pattern electrodes 14 are laminated on an upper surface of the active piezoelectric portion 110, and the second pattern electrodes 15 are laminated on a lower surface of the active piezoelectric portions 110 and the inactive piezoelectric portions 111. This configuration prevents the generated electric charge from leaking around the first pattern electrodes 14 and going into other first pattern electrodes 14 (i.e., preventing the cross-talk phenomenon). As a result, the position detection accuracy and load detection accuracy are improved.

As shown in FIG. 26, the second pattern electrodes 15 may be laminated on the lower surface of the active piezoelectric portion 110, and the first pattern electrodes 14 may be laminated on the upper surfaces of the active piezoelectric portions 110 and the inactive piezoelectric portions 111. Although examples are shown in which the first pattern electrodes 14 and the second pattern electrodes 15 are directly laminated on the active piezoelectric portion 110 in the previously mentioned case, an insulating material such as adhesive and a film may be laminated between the active piezoelectric portions 110 and the first pattern electrodes 14, or between the active piezoelectric portions 110 and the second pattern electrodes 15.

16. Sixteenth Embodiment

Although the configuration was described in which the piezoelectric layer 11 is interposed between the upper electrode 12 and the lower electrode 13 in the previously mentioned tenth to fifteenth embodiments, a reference electrode 40 may be disposed between the upper electrode 12 and the lower electrode 13.

Figure 27:
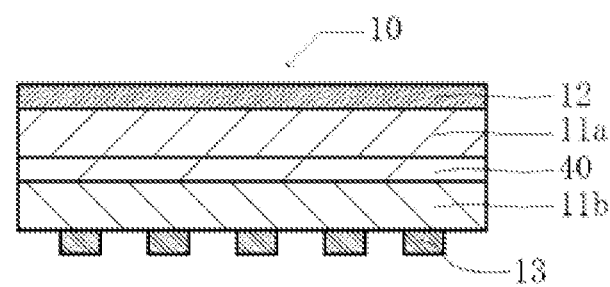
FIG. 27 is a cross section of the piezoelectric sensor.

FIG. 27 is a cross section of e piezoelectric sensor according to the sixteenth embodiment.

As shown in FIG. 27, in the piezoelectric sensor 10 of the sixteenth embodiment, the reference electrode 40 is provided between the upper electrode 12 and the lower electrode 13. A first piezoelectric layer 11a is provided between the upper electrode 12 and the reference electrode 40. A second piezoelectric layer 11b is provided between the lower electrode 13 and the reference electrode 40. Materials of the first piezoelectric layer 11a and the second piezoelectric layer 11b are the same as that of the piezoelectric layer 11. A material of the reference electrode 40 is the same as that of the upper electrode 12 and the lower electrode 13.

If the reference electrode 40 is provided between the upper electrode 12 and the lower electrode 13, the electric charge generated at the first piezoelectric layer 11a and the second piezoelectric layer 11b can be independently detected by the upper electrode 12 and the lower electrode 13. As a result, the design of the detecting circuit becomes simple.

Figure 28:
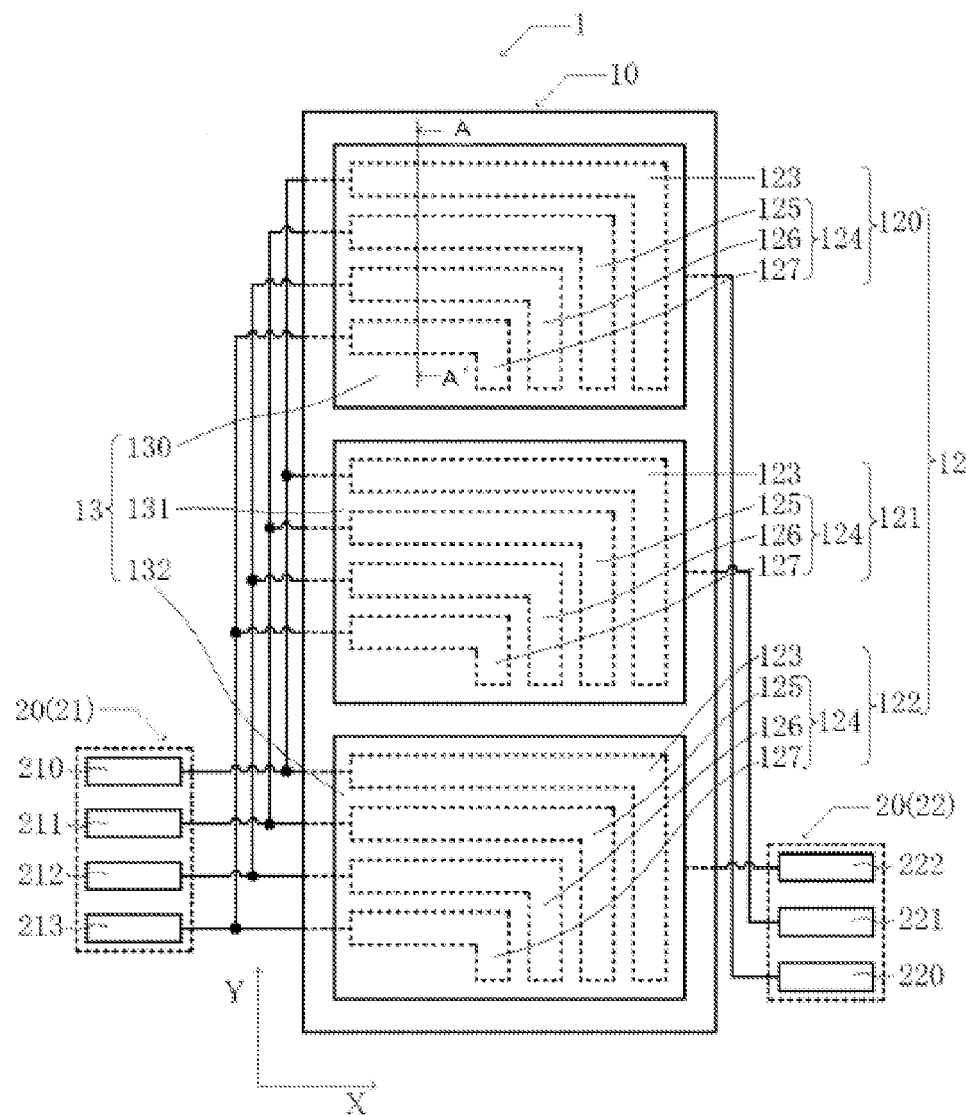
FIG. 28 is a conceptual diagram of the pressure detection apparatus.
Figure 29:
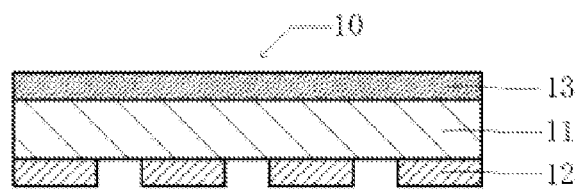
FIG. 29 is an A-A' cross section in FIG. 28.

17. Seventeenth Embodiment (1) The Entire Structure of the Pressure Detection Apparatus Referring to FIG. 28, the entire structure of the pressure detection apparatus according to the seventeenth embodiment of the present invention will be described. FIG. 28 is a schematic diagram of the pressure detection apparatus. FIG. 29 is an A-A' cross section in FIG. 28.

As shown in FIG. 28, the pressure detection apparatus 1 includes a piezoelectric sensor 10 and a detection unit 20. The piezoelectric sensor 10 is a device that generates electric charge in response to the applied load. The detection unit 20 is a device that detects the electric charge generated in the piezoelectric layer 11. The configuration of the pressure detection apparatus 1 will be described below in detail.

(2) Piezoelectric Sensor

As shown in FIG. 29, the piezoelectric sensor 10 includes a piezoelectric layer 11, an upper electrode (first electrode) 12 and a lower electrode (second electrode) 13 interposing a piezoelectric sensor 10. The first electrode 12 is provided on a first main surface of the piezoelectric layer 11, and the second electrode 13 is provided on a second main surface of the piezoelectric layer 11 opposite to the first main surface. A reference electrode (not shown) may be provided between the first electrodes 12 and the second electrodes 13.

Figure 30:
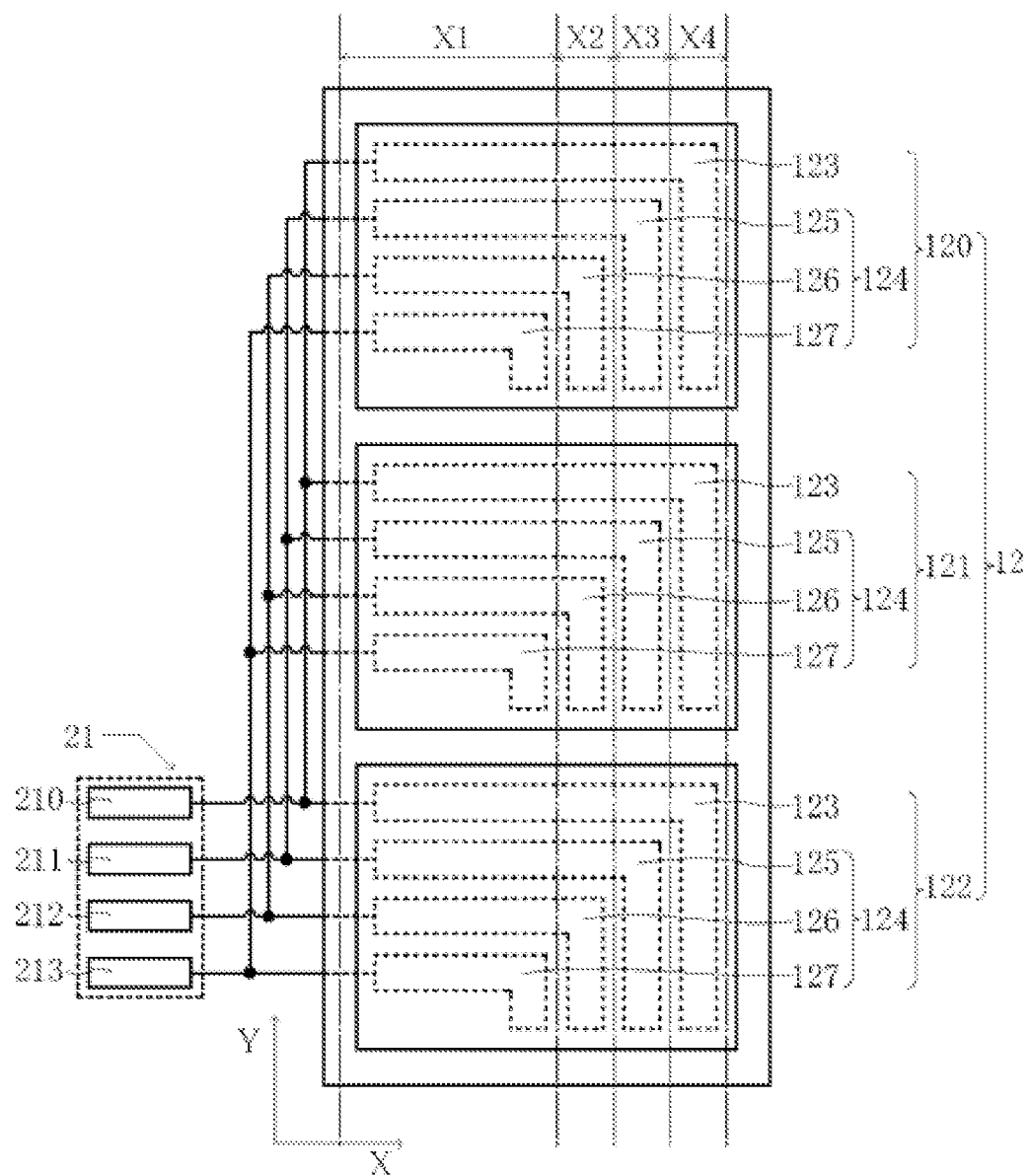
FIG. 30 is a conceptual diagram of the pressure detection apparatus.

As shown in FIG. 30, the first electrode 12 includes a first pattern electrode 120, a second pattern electrode 121, and a third pattern electrode 122. The previously mentioned electrodes patterns are arranged in Y-axis direction. Each of the pattern electrodes include an L-shaped reference electrodes 123 and L-shaped electrodes 124.

The L-shaped reference electrode 123 is arranged outside of the L-shaped electrodes 124, and consists of two sides. A shorter side of the two sides is arranged in Y-axis direction, and a longer side is arranged in X-axis direction perpendicular to Y-axis direction.

The L-shaped electrodes 124 are arranged inside of the L-shaped reference electrode 123. The L-shaped electrodes 124 include a first L-shaped electrode 125, a second L-shaped electrode 126, and a third L-shaped electrode 127.

Shorter sides of the first L-shaped electrode 125 through the third L-shaped electrode 127 are arranged in Y-axis direction, and longer sides are arranged in X-axis direction. In addition, ends of the shorter side of the L-shaped electrode 124 are arranged on extension lines of an end of the shorter side of the L-shaped reference electrode 123, and ends of the longer side are arranged on extension lines of an end of the longer side of the L-shaped reference electrode 123.

The first L-shaped electrode 125 is arranged inside of the L-shaped reference electrode 123. The second L-shaped electrode 126 is arranged inside of the first L-shaped electrode 125. The third L-shaped electrode 127 is arranged inside of the second L-shaped electrode 126.

Figure 31:
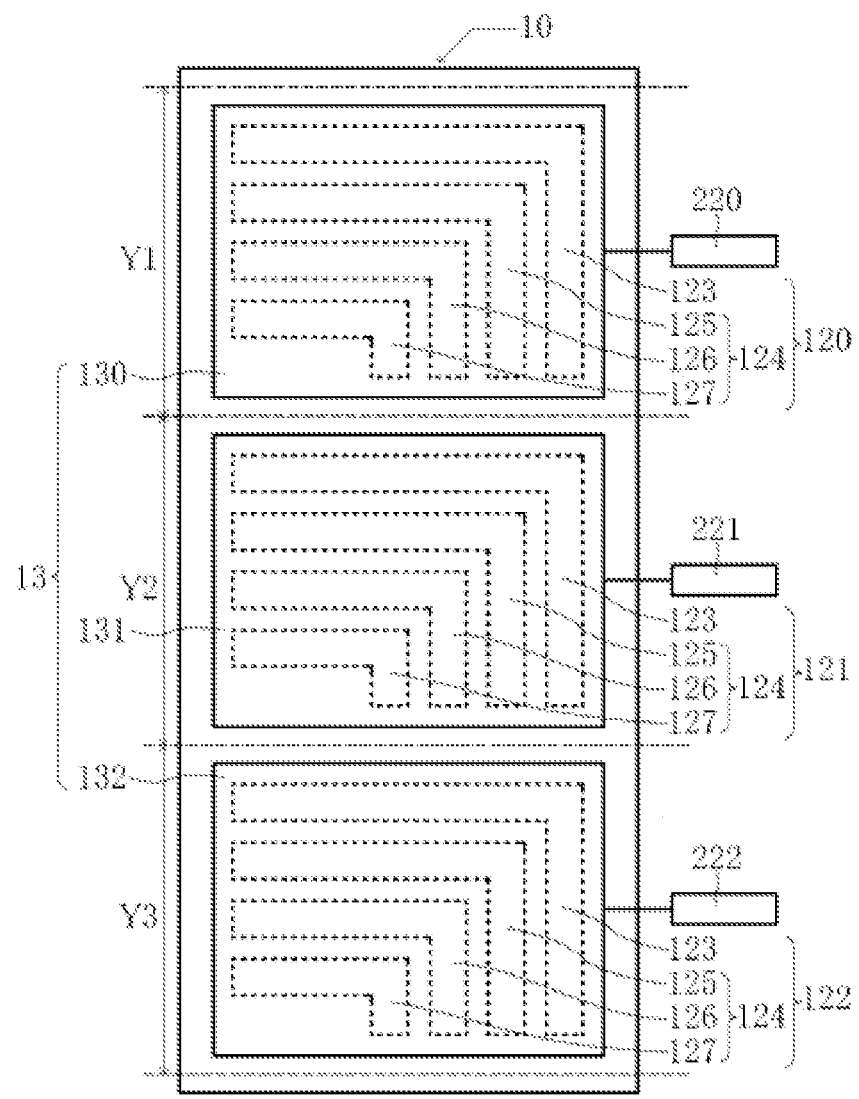
FIG. 31 is a conceptual diagram of the pressure detection apparatus.

As shown in FIG. 31, the second electrodes 13 includes a plurality of strip-like electrodes. The strip-like electrodes are composed of a first strip-like electrode 130, a second strip-like electrode 131, and a third strip-like electrode 132, which are arranged in Y-axis direction. The strip-like electrodes cover the electrode pattern of the first electrode 12 via the piezoelectric layer 11. In other words, the first strip-like electrodes 130 covers the first pattern electrode 120, the second strip-like electrodes 131 covers the second pattern electrode 121, and the third strip-like electrodes 132 cover the third pattern electrode 122.

Although an example was described in which the first electrodes 12 consists of three pattern electrodes, i.e., the first pattern electrode 120 through the third pattern electrode 122 in the previously mentioned embodiment, the number of the pattern electrodes is not limited to three. In other words, the first electrodes may have n (n=1, 2, 3 . . . ) pattern electrodes. This is applied to the L-shaped electrodes and the strip-like electrodes.

(3) Electrodes

The first electrodes 12 and the second electrodes 13 can be made of conductive materials similar to those shown in "1. First Embodiment".

(4) Piezoelectric Layer

The material of the piezoelectric layer 11 may include inorganic piezoelectric material and organic piezoelectric material similar to those shown in "1. First Embodiment".

In a case in which the pressure detection apparatus 1 is placed on a display device such as a liquid crystal device and an organic EL device, it is preferable that the piezoelectric layer be made of a transparent material or thin enough to transmit light sufficiently, such that the display of display device can be seen.

(5) Detection Unit

As shown in FIG. 28, the detection unit 20 includes a first detection unit 21 and a second detection unit 22. Again, as shown in FIG. 30, the first detection unit 21 includes an L-shaped reference electrode detection unit 210, a first L-shaped electrode detection unit 211, a second L-shaped electrode detection unit 212, and a third L-shaped electrode detection unit 213. The L-shaped reference electrode detection unit 210 is connected to the L-shaped reference electrodes 123. Similarly, the first L-shaped electrode detection unit 211 is connected to the first L-shaped electrodes 125, the second L-shaped electrode detection unit 212 is connected to the second L-shaped electrodes 126, and the third L-shaped electrode detection unit 213 is connected to the third L-shaped electrodes 127.

According to the previously mentioned configuration, it is possible to detect the electric charge generated in the piezoelectric layer 11, which is disposed below the L-shaped reference electrode 123, when the piezoelectric layer is pressed, by the L-shaped reference electrode detection unit 210. The electric charge generated in the piezoelectric layer 11 disposed below the first L-shaped electrode 125, the second L-shaped electrode 126, and the third L-shaped electrode 127 can be detected respectively by the first L-shaped electrode detection unit 211, the second L-shaped electrode detection unit 212, and the third L-shaped electrode detection unit 213.

Again, as shown in FIG. 31, the second detection unit 22 includes a first strip-like electrode detection unit 220, a second strip-like electrode detection unit 221, and a third strip-like electrode detection unit 222. The first strip-like electrode detection unit 220 is connected to the first strip-like electrodes 130. Similarly, the second strip-like electrode detection unit 221 is connected to the second strip-like electrodes 131, and the third strip-like electrode detection unit 222 is connected to the third strip-like electrodes 132.

According to the previously mentioned configuration, it is possible to detect the electric charge generated in the piezoelectric layer 11, which is disposed below the first strip-like electrode 130, when the piezoelectric layer 11 is pressed, by the first strip-like electrode detection unit 220. The electric charge generated in the piezoelectric layer 11 disposed below the second strip-like electrodes 131 and the third strip-like electrodes 132 can be detected respectively by the second strip-like electrode detection unit 221, and the third strip-like electrode detection unit 222.

The pressure detection apparatus 1 is configured as described above, again, as shown in FIG. 30, the L-shaped reference electrode 123, the first L-shaped electrode 125, the second L-shaped electrode 126, and the third L-shaped electrode 127 are arranged in X1 area along X-axis direction. In X2 area, the L-shaped reference electrode 123, the first L-shaped electrode 125, and the second L-shaped electrode 126 are arranged. In X3 area, the L-shaped reference electrode 123 and the first L-shaped electrode 125 are arranged. In X4 area, the L-shaped reference electrode 123 is arranged. The L-shaped reference electrode 123 is connected to the L-shaped reference electrode detection unit 210, the first L-shaped electrode 125 is connected to the first L-shaped electrode detection unit 211, the second L-shaped electrode 126 is connected to the second L-shaped electrode detection unit 212, and the third L-shaped electrode 127 is connected to the third L-shaped electrode detection unit 213.

Accordingly, if the load is applied to X1 area, the electric charge generated by the load is detected, via the L-shaped reference electrode 123, the first L-shaped electrode 125, the second L-shaped electrode 126, and the third L-shaped electrode 127, at four detection units, i.e., the L-shaped reference electrode detection unit 210, the first L-shaped electrode detection unit 211, the second L-shaped electrode detection unit 212, and the third L-shaped electrode detection unit 213.

If the load is applied to X2 area, the L-shaped reference electrode 123, the electric charge is detected via the first L-shaped electrode 125 and the second L-shaped electrode 126, by three detection units, i.e., the L-shaped reference electrode detection unit 210, the first L-shaped electrode detection unit 211, and the second L-shaped electrode detection unit 212.

If the load is applied to X3 area, the electric charge is detected, via the L-shaped reference electrode 123 and the first L-shaped electrode 125, by two detection units, i.e., the L-shaped reference electrode detection unit 210 and the first L-shaped electrode detection unit 211.

If the load is applied to X4 area, the electric charge is detected, via the L-shaped reference electrode 123, by one detection unit, i.e., the L-shaped reference electrode detection unit 210.

In other words, the number of the detection units that detects the electric charge are different depending on the load-applied places along the X-axis direction. It is possible to specify the position to which the load is applied in X-axis direction by utilizing the difference.

Furthermore, according to the previously mentioned configuration, as shown in FIG. 31, the first strip-like electrode 130 are arranged in Y1 area in Y-axis direction, the second strip-like electrode 131 are arranged in Y2 area, the third strip-like electrode 132 are arranged in Y3 area. The first strip-like electrode 130, the second strip-like electrode 131, and the third strip-like electrode 132 are respectively connected to the first strip-like electrode detection unit 220, the second strip-like electrode detection unit 221, and the third strip-like electrode detection unit 222.

Accordingly, if the load is applied to Y1 area, the electric charge generated by the load is detected by the first strip-like electrode detection unit 220 via the first strip-like electrode 130. If the load is applied to Y2 area, the electric charge is detected by the second strip-like electrode detection unit 221 via the second strip-like electrode 131. If the load is applied to Y3 area, the electric charge is detected by the third strip-like electrode detection unit 222 via the third strip-like electrode 132.

In other words, kinds of the detection units for detecting electric charges are different depending on the load-applied places along Y-axis direction. It is possible to specify the position to which the load is applied in Y-axis direction by making use of the difference.

Finally, it is possible to specify the load-applied position by combining the detected position information in X-axis direction and Y-axis direction.

The load amount is detected by obtaining the total of the detected electric charges. The method of obtaining the load amount according to the electric charge amount can be achieved by programming the conversion method in the detection in advance. Accordingly, it is possible to specify the position of the piezoelectric sensor to which the load is applied and the load amount.

As described above, the first electrodes 12, constituting the piezoelectric sensor 10, includes the L-shaped reference electrode 123 and the L-shaped electrodes 124. The L-shaped electrodes 124 are arranged inside of two sides of the L-shaped reference electrode 123 with a gap therebetween and includes end sides on the extension lines of the end sides of the L-shaped reference electrode 123. Accordingly, the number of the L-shaped reference electrode 123 and the L-shaped electrodes 124 are different depending on the position in X-axis direction.

In other words, if the load is applied to any units in the piezoelectric sensor 10, the number of the first detection units 21 that detects the electric charge become a specific one depending on the load-applied position in X-axis direction. Accordingly, it is possible to specify the position of the applied load in X-axis direction by detecting the number.

Furthermore, the second electrodes 13, constituting the piezoelectric sensor 10, includes the strip-like electrodes that cover the L-shaped reference electrode 123 and the L-shaped electrode 124, and the strip-like electrodes are independently connected to the strip-like electrode detection units. Accordingly, it is possible to specify the load-applied position in Y-axis direction based on kinds of the strip-like electrode detection units that detects the electric charge.

Accordingly, it is possible to specify position to which the load is applied by combining the detection results between the first electrodes and the second electrodes.

Furthermore, the applied load amount is detected by obtaining the applied load based on the total of the detected electric charges. The method of obtaining the load amount according to the electric charge amount can be achieved by programming the conversion method in the detection in advance.

Accordingly, according to the previously mentioned configuration, the pressure detection apparatus according to the present application, it is possible to detect position and load amount of the applied load when the load is applied.

18. Eighteenth Embodiment

In the seventeenth embodiment, the piezoelectric sensor includes the piezoelectric layer, the first electrode, and the second electrode. The first electrode includes the L-shaped reference electrode and the L-shaped electrodes, and the second electrode include the strip-like electrodes. However, the first electrodes may include strip-like electrodes, and the second electrodes may include stepped electrodes. Below, the strip-like electrodes of the first electrodes and the stepped electrodes of the second electrodes will be described.

Figure 32:
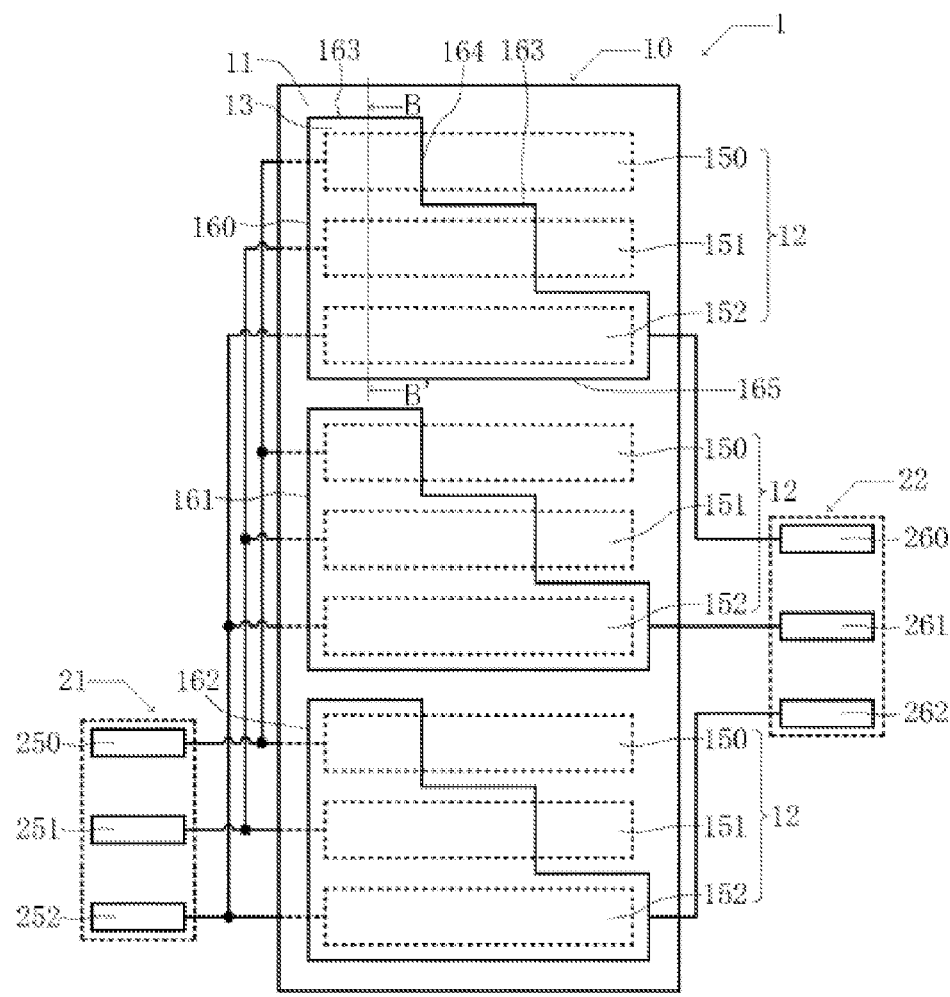
FIG. 32 is a conceptual diagram of the pressure detection apparatus.
Figure 33:
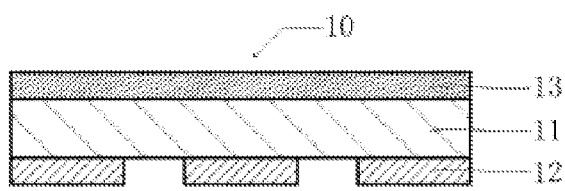
FIG. 33 is a B-B' cross section in FIG. 32.

FIG. 32 is a plane view of the pressure detection apparatus 1 according to the eighteenth embodiment. FIG. 33 is a B-B' cross section in FIG. 32.

As shown in FIG. 32, the pressure detection apparatus 1 includes a piezoelectric sensor 10, a first detection unit 21, and a second detection unit 22. The piezoelectric sensor 10 includes a piezoelectric layer 11, first electrodes 12, and second electrodes 13. The first electrodes 12 are arranged on a first main surface of the piezoelectric layer 11, and the second electrodes 13 is arranged on a second main surface opposite of the first main surface of the piezoelectric layer 11. The first detection unit 21 includes a first strip-like electrode detection units 250, a second strip-like electrode detection unit 251, and a third strip-like electrode detection unit 252. The second detection unit 22 includes a first stepped electrode units 260, a second stepped electrode detection unit 261, and a third stepped electrode detection unit 262.

Figure 34:
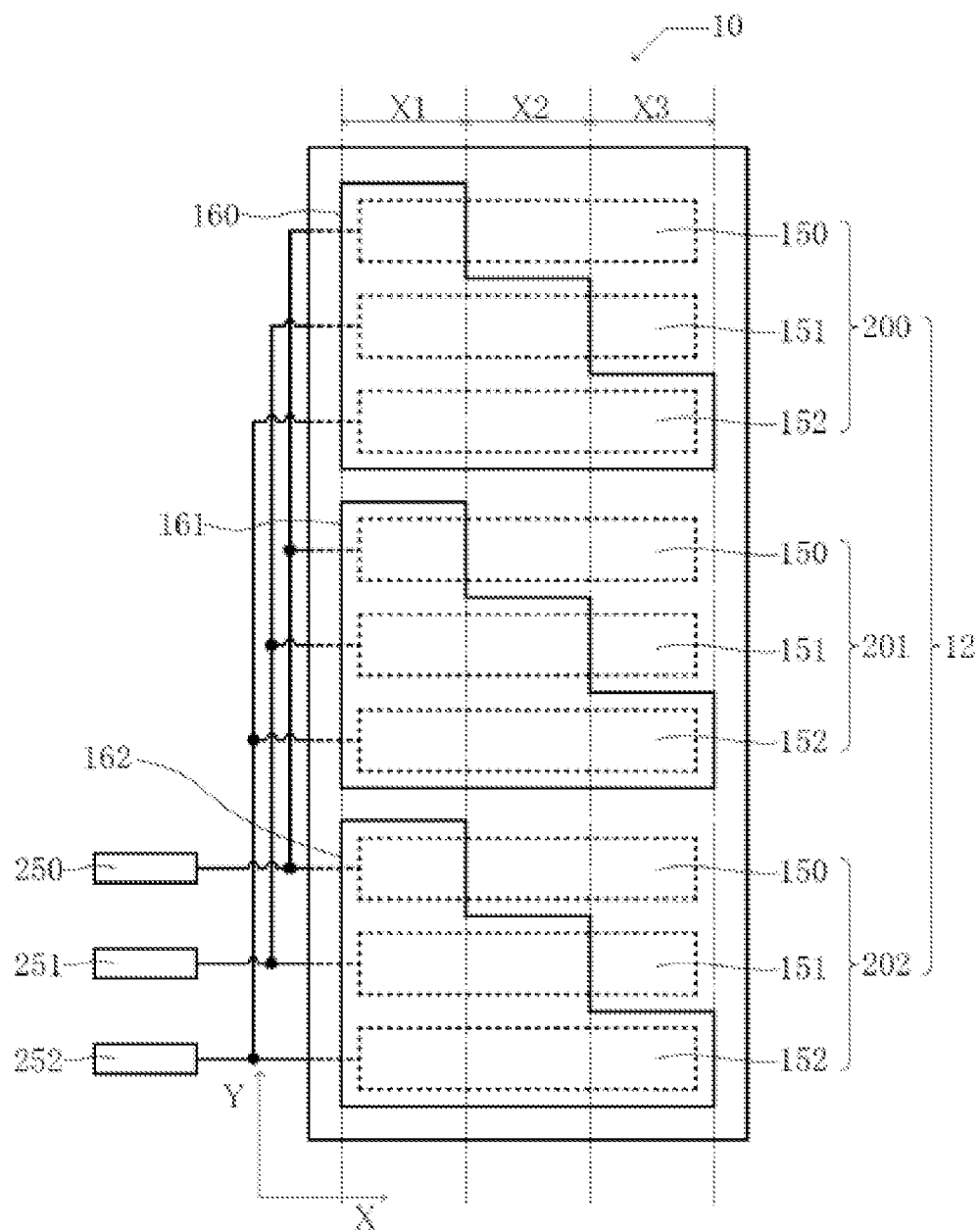
FIG. 34 is a conceptual diagram of the pressure detection apparatus.

As shown in FIG. 34, the first electrodes 12 includes a first strip-like pattern electrode 200, a second strip-like pattern electrodes 201, and a third strip-like pattern electrode 202, which are arranged in Y-axis direction. The strip-like pattern electrodes include a first strip-like electrode 150 a second strip-like electrodes 151, and a third strip-like electrodes 152, which are arranged in Y-axis direction. The first strip-like electrodes 150 of the strip-like pattern electrodes are connected to the first strip-like electrode detection unit 250. The second strip-like electrodes 151 and the third strip-like electrodes 152 of the strip-like pattern electrodes are respectively connected to the second strip-like electrode detection unit 251 and the third strip-like electrode detection unit 252.

Figure 35:
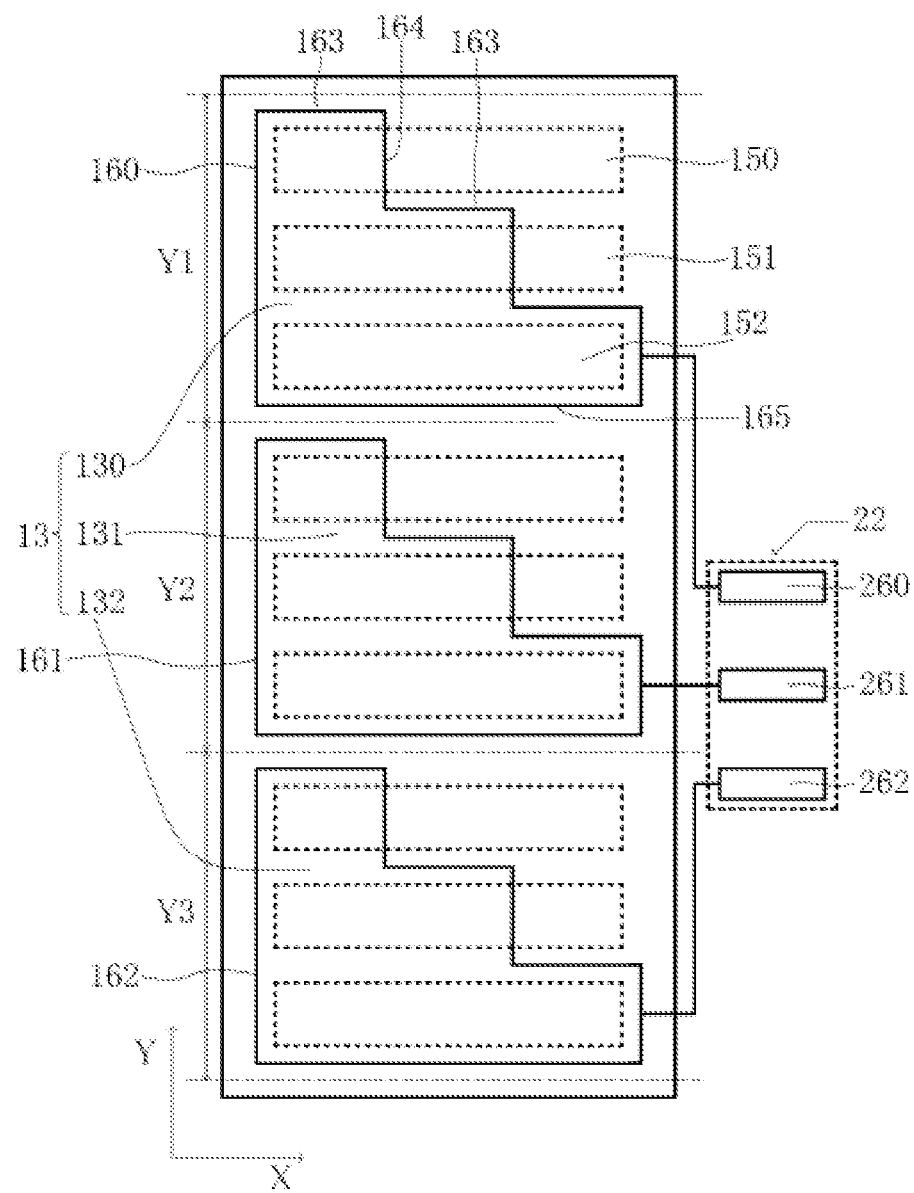
FIG. 35 is a conceptual diagram of the pressure detection apparatus.

As shown in FIG. 35, the second electrode 13 includes step-wise stepped electrodes arranged in Y-axis direction. The stepped electrodes includes a first stepped electrode 160, a second stepped electrode 161, and a third stepped electrode 162. Each of the stepped electrodes includes tread portions 163, rise portions 164, and an L-shaped portion 165. The tread portions 163 are arranged in a plane view in a direction parallel with the strip-like electrodes. In other words, tread portions 163 are arranged above the first strip-like electrodes 150, between the first strip-like electrode 150 and the second strip-like electrode 151, between the second strip-like electrode 151 and the third strip-like electrode 152, and below the third strip-like electrode 152 with a gap between each other. The rise portions 164 are arranged in a direction crossing the strip-like electrodes, and connect the tread portions 163 with each other. The L-shaped portion 165 has a shape of L connecting a start point of the tread portion 163 and an end point of the rise portions 164. The first stepped electrode 160 is connected to a first stepped electrode portion 260, the second stepped electrode 161 is connected to a second stepped electrode detection unit 261, and the third stepped electrode 162 is connected to a third stepped electrode detection unit 262, independently.

The strip-like electrodes and the stepped electrodes are arranged such that the first strip-like electrodes 150, the second strip-like electrodes 151, and the third strip-like electrodes 152 of the strip-like electrodes intersect the rise portions 164 of the stepped electrodes.

As shown in FIG. 34, according to the previously mentioned configuration, in X1 area in X-axis direction, the first strip-like electrodes 150, the second strip-like electrodes 151, and the third strip-like electrodes 152 of the strip-like pattern electrodes overlap the first stepped electrode 160, the second stepped electrode 161, and the third stepped electrode 162.

In X2 area, the second strip-like electrodes 151 and the third strip-like electrodes 152 of the strip-like pattern electrodes overlap the first stepped electrode 160, the second stepped electrode 161, and the third stepped electrode 162.

In X3 area, the third strip-like electrodes 152 of the strip-like pattern electrodes overlaps the first stepped electrode 160, the second stepped electrode 161, and the third stepped electrode 162.

Accordingly, if the load is applied to X1 area, the electric charge generated by the load is detected by the first strip-like electrode detection unit 250, the second strip-like electrode detection unit 251, and the third strip-like electrode detection unit 252, through the first strip-like electrodes 150, the second strip-like electrodes 151, and the third strip-like electrodes 152 of the strip-like pattern electrodes.

If the load is applied to X2 area, the electric charge is detected by the second strip-like electrode detection unit 251 and the third strip-like electrode detection unit 252, through the second strip-like electrodes 151 and the third strip-like electrodes 152 of the strip-like pattern electrodes.

If the load is applied to X3 area, the electric charge is detected by the third strip-like electrode detection unit 252 through the third strip-like electrodes 152 of the strip-like pattern electrodes.

In other words, depending on the load-applied places along X-axis direction, the number of the detection units that detects the electric charge is different. It is possible to specify the position to which the load is applied in X-axis direction by utilizing the difference.

In addition, as shown in FIG. 35, the first stepped electrode 160 is disposed in Y1 area in Y-axis direction, the second stepped electrode 161 is disposed in Y2 area, and the third stepped electrode 162 is disposed in Y3 area.

Accordingly, if the load is applied to Y1 area, the electric charge generated by the load is detected by the first stepped electrode portion 260 through the first stepped electrode 160. If the load is applied to Y2 area, the electric change is detected, by the second stepped electrode detection unit 261 through the second stepped electrode 161. If the load is applied is to Y3 area, the load is detected by the third stepped electrode detection unit 262 through the third stepped electrode 162.

In other words, depending on the load-applied places along Y-axis direction, kinds of the detection units for detecting electric charges are different. It is possible to specify the position to which the load is applied in Y-axis direction by utilizing the difference.

Finally, it is possible to specify the load-applied position by combining the detected position information in X-axis direction and Y-axis direction.

As described above, in the piezoelectric sensor 10, the piezoelectric layer 11, the first electrodes 12, and, the second electrodes 13 are arranged on the first surface, and the first electrodes 12 and the second electrodes 13 are arranged on the second surface of the piezoelectric layer 11. The first electrodes 12 includes strip-like pattern electrodes consisting of a plurality of strip-like electrodes arranged in Y-axis direction (the first strip-like electrodes 150, the second strip-like electrodes 151, and the third strip-like electrodes 152), and the second electrodes 13 connect a plurality of tread portions 163 with each other. The stepped electrodes (the first stepped electrode 160, the second stepped electrode 161, and the third stepped electrode 162) include a plurality of rise portions 164, which cross the strip-like electrodes (the first strip-like electrodes 150, the second strip-like electrodes 151, and the third strip-like electrodes 152) one by one, and the L-shaped connecting portion 165 connects the start point of the tread portions 163 and the end point of rise portions 164. Accordingly, depending on positions in X-axis direction, the number of the overlapping between strip-like electrodes (the first strip-like electrodes 150, the second strip-like electrodes 151, the third strip-like electrodes 152) and the stepped electrodes (the first stepped electrode 160, the second stepped electrode 161, and the third stepped electrode 162) via the piezoelectric layer 11 are different.

In other words, if the load is applied to a certain portion of the piezoelectric sensor 10, the number of the first detection units 21 that detects the electric charge becomes a specific one depending on the load-applied position in X-axis direction, so that it is possible to specify position of the applied load in X-axis direction by detecting the number.

Furthermore, according to the previously mentioned configuration, the stepped electrodes are arranged in Y-axis direction, and the stepped electrodes are connected to the stepped electrode detection units independently. Accordingly, it is possible to specify the load-applied position in Y-axis direction utilizing kinds of the strip-like electrode detection units that detects the electric charge.

Accordingly, it is possible to specify the position to which the load is applied by combining detection results of the first electrodes and the second electrodes.

Furthermore, the applied load amount is detected by obtaining the applied load based on the total of the detected electric charges. The method of obtaining the load amount according to the electric charge amount can be performed by programming a conversion method in the detection in advance.

Accordingly, according to the previously mentioned configuration, the pressure detection apparatus of the present application can detect the position and load amount of the applied load when the load is applied.

19. Nineteenth Embodiment

The piezoelectric layer 11 may be patterned so as to have active portions and inactive portions.

Figure 36:
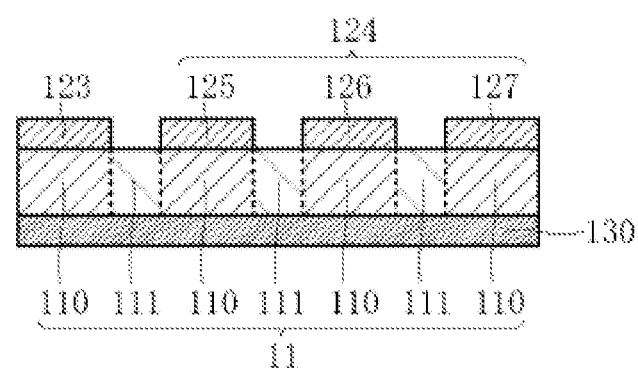
FIG. 36 is a cross section of the piezoelectric sensor.

FIG. 36 is a cross section of the piezoelectric sensor according to the nineteenth embodiment.

As shown in FIG. 36, the piezoelectric layer 11 includes active piezoelectric portions 110 and inactive piezoelectric portions 111.

The active piezoelectric portions 110 are portions where the electric charge is generated when the load is applied to the piezoelectric sensor 10. In contrast, the inactive piezoelectric portions 111 are portions where the electric charge is not generated even if the load is applied.

In an example of FIG. 36, on an upper surface of the active piezoelectric portions 110, an L-shaped reference electrode 123, and an L-shaped electrodes 124 (a first L-shaped electrode 125, a second L-shaped electrode 126, and a third L-shaped electrode 127) are arranged. On a lower surface of the active piezoelectric portions 110 and the inactive piezoelectric portions 111, first strip-like electrodes 130 are arranged. This configuration prevents the generated electric charge from leaking around the L-shaped reference electrodes 123 and from mixing into the L-shaped electrodes 124 (i.e., preventing the cross-talk phenomenon). As a result, the position detection accuracy and load detection accuracy are improved. Although an example is shown in FIG. 36 in which the L-shaped reference electrode 123 and the L-shaped electrode 124 are directly laminated on the active piezoelectric portions 110, insulating materials such as adhesive or a film may be laminated between the active piezoelectric portions 110 and the L-shaped reference electrode 123, or between the active piezoelectric portion 110 and the L-shaped electrodes 124.

20. Other Embodiments

Figure 37:
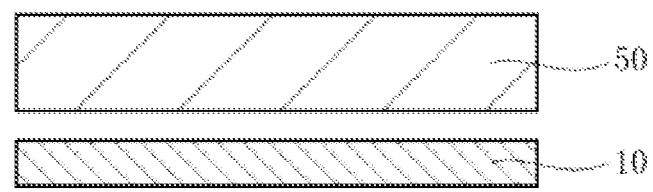
FIG. 37 is a cross section of the pressure detection apparatus combining the piezoelectric sensor and the touch panel.

In the previously mentioned first through nineteenth embodiment, examples are shown in which position and amount of the applied load is detected by the piezoelectric sensor 10. However, as shown in FIG. 37, position and amount of the applied load is detected by laminating a touch panel 50 on the piezoelectric sensor 10.

Since the touch panel 50 is laminated on the piezoelectric sensor 10, even if the applied load is too small to be detected by the piezoelectric sensor 10 (in case of feather touch), it is possible to detect the portion to which the load is applied by laminating the touch panel 50 on the piezoelectric sensor 10. It is particularly preferable that a capacitance type touch panel be employed among the touch panels.

The invention claimed is:

1. A piezoelectric sensor comprising:
   an upper electrode;
   a lower electrode; and
   a piezoelectric layer interposed between the upper electrode and the lower electrode;
   at least one of the upper electrode and the lower electrode including a plurality of electrode patterns;
   the upper electrode including a plurality of first pattern electrodes extending in a first direction;
   the lower electrode including a plurality of second pattern electrodes extending in the same direction as that of the first pattern electrodes; and
   at least one of the following:
      a width of the first pattern electrodes becomes larger as the first pattern electrodes approach a peripheral portion of the piezoelectric layer; and
      a width of the second pattern electrodes becomes larger as the second pattern electrodes approach the peripheral portion of the piezoelectric layer.

2. The piezoelectric sensor according to claim 1, wherein the first pattern electrode includes:
   a plurality of first electrodes laminated on the piezoelectric layer with a gap between each other; and
   first connecting portions formed between the adjacent first electrodes, and electrically connecting the first electrodes with each other; and
   the second pattern electrode includes:
   a plurality of second electrodes laminated below the piezoelectric layer, and overlapping the first electrodes; and
   second connecting portions electrically connecting the second electrodes with each other.

3. The piezoelectric sensor according to claim 2, wherein the first electrodes are arranged such that the first electrodes overlap the second electrode via the piezoelectric layer.

4. The piezoelectric sensor according to claim 1, wherein the first pattern electrodes have a strip-shape.

5. The piezoelectric sensor according to claim 1, wherein the second pattern electrodes have a strip-shape.

6. The piezoelectric sensor according to claim 1, wherein the width of the first pattern electrodes becomes larger as the first pattern electrodes approach the peripheral portion of the piezoelectric layer.

7. The piezoelectric sensor according to claim 1, wherein the width of the second pattern electrodes becomes larger as the second pattern electrodes approach the peripheral portion of the piezoelectric layer.

8. The piezoelectric sensor according to claim 1, wherein pitch intervals of the first pattern electrodes are constant.

9. The piezoelectric sensor according to claim 1, wherein pitch intervals of the second pattern electrodes are constant.

10. The piezoelectric sensor according to claim 1, wherein the piezoelectric layer includes active piezoelectric portions and inactive piezoelectric portions, and the first pattern electrodes are laminated on the active piezoelectric portions.

11. The piezoelectric sensor according to claim 1, wherein the piezoelectric layer includes active piezoelectric portions and inactive piezoelectric portions, and the second pattern electrodes are laminated on the active piezoelectric portions.

12. The pressure detection apparatus according to claim 11, wherein the touch panel is a capacitance type touch panel.

13. The pressure detection apparatus further comprising a touch panel provided on the piezoelectric sensor according to claim 1.

14. A piezoelectric sensor comprising:
an upper electrode;
a lower electrode; and
a piezoelectric layer interposed between the upper electrode and the lower electrode, the piezoelectric layer including:
   a first piezoelectric layer in contact with the upper electrode;
   a second piezoelectric layer in contact with the lower electrode; and
   a reference electrode arranged between the first piezoelectric layer and the second piezoelectric layer;
at least one of the upper electrode and the lower electrode including a plurality of electrode patterns;
the upper electrode including a plurality of first pattern electrodes extending in a first direction; and
the lower electrode including a plurality of second pattern electrodes extending in the same direction as that of the first pattern electrodes.

15. A piezoelectric sensor comprising:
an upper electrode;
a lower electrode; and
a piezoelectric layer interposed between the upper electrode and the lower electrode;
at least one of the upper electrode and the lower electrode including a plurality of electrode patterns;
the upper electrode including a plurality of first pattern electrodes extending in a first direction;
the lower electrode including a plurality of second pattern electrodes extending in the same direction as that of the first pattern electrodes; and
at least one of the following:
   the first pattern electrodes have a concave-convex shape, and the first pattern electrodes are arranged such that convex portions and concave portions of the concave-convex shape engage with each other between the first pattern electrodes, and a pitch interval of the first pattern electrodes is shorter than a length of a shorter diameter of a contact surface formed when an input makes contact with the piezoelectric sensor; and
   the second pattern electrodes have a concave-convex shape, and the second pattern electrodes are arranged such that convex portions and concave portions of the concave-convex shape engage with each other between the second pattern electrodes, and a pitch interval of the second pattern electrodes is shorter than the length of the shorter diameter of the contact surface formed when the input makes contact with the piezoelectric sensor.

16. The piezoelectric sensor according to claim 15, wherein the first pattern electrodes have the concave-convex shape, and the first pattern electrodes are arranged such that convex portions and concave portions of the concave-convex shape engage with each other between the first pattern electrodes, and the pitch interval of the first pattern electrodes is shorter than the length of the shorter diameter of the contact surface formed when the input makes contact with the piezoelectric sensor.

17. The piezoelectric sensor according to claim 15, wherein the second pattern electrode has the concave-convex shape, and the second pattern electrode is arranged such that convex portions and concave portions of the concave-convex shape engage with each other between the second pattern electrodes, and the pitch interval of the second pattern electrodes is shorter than the length of the shorter diameter of the contact surface formed when the input makes contact with the piezoelectric sensor.

* * * * *